(12) United States Patent
Aizawa et al.

(10) Patent No.: US 12,306,265 B2
(45) Date of Patent: May 20, 2025

(54) DIAGNOSTIC APPARATUS, DIAGNOSTIC SYSTEM AND DIAGNOSTIC METHOD OF ELECTRIC POWER CONVERTER AND NON-TRANSITORY STORAGE MEDIUM

(71) Applicant: Kabushiki Kaisha Toshiba, Tokyo (JP)

(72) Inventors: Toshimitsu Aizawa, Yokohama Kanagawa (JP); Shinichi Kominato, Tokyo (JP); Tsuyoshi Shinohara, Yokohama Kanagawa (JP); Kohei Hasegawa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 132 days.

(21) Appl. No.: 18/063,932

(22) Filed: Dec. 9, 2022

(65) Prior Publication Data

US 2023/0251327 A1 Aug. 10, 2023

(30) Foreign Application Priority Data

Feb. 8, 2022 (JP) ................. 2022-018092

(51) Int. Cl.
 *G01R 31/42* (2006.01)
 *G01R 19/175* (2006.01)
 (Continued)

(52) U.S. Cl.
 CPC ........ *G01R 31/42* (2013.01); *H02M 7/53871* (2013.01); *H02P 29/024* (2013.01)

(58) Field of Classification Search
 CPC ........ G01R 31/02; G01R 31/26; G01R 31/42; G01R 19/175
 See application file for complete search history.

(56) References Cited

U.S. PATENT DOCUMENTS 8,913,352 B2 * 12/2014 Majarov ................... G06F 1/04
 361/18
2003/0117823 A1 6/2003 Sato
 (Continued)

FOREIGN PATENT DOCUMENTS

JP 2009-019953 A 1/2009
JP 2012-018025 A 1/2012
 (Continued)

OTHER PUBLICATIONS

"Transient thermal resistance vs. safe operating area (SOA)", https://toshiba.semicon-storage.com/jp/semiconductor/knowledge/faq/mosfet_bipoler-transistors/transient-thermal-resistance-yssafe-operating-area.html, Accessed Aug. 1, 2022.
 (Continued)

*Primary Examiner* — Neel D Shah
(74) *Attorney, Agent, or Firm* — KNOBBE, MARTENS, OLSON & BEAR, LLP

(57) ABSTRACT

In an embodiment, a diagnostic apparatus of an electric power converter is provided, and the electric power converter outputs a converted AC electric power to an electric motor, thereby driving the electric motor. The diagnostic apparatus includes an output control unit and a degradation determination unit. The output control unit controls operations of semiconductor elements of the electric power converter, thereby outputting electric power from the electric power converter to the electric motor by constant voltage output, which constantly sets an output voltage to the electric motor in a target voltage pattern. The degradation determination unit determines a degradation state for at least one of the semiconductor elements based on a current flowing through the electric motor in the constant voltage output.

11 Claims, 13 Drawing Sheets

(51) Int. Cl.
    *G01R 31/26*     (2020.01)
    *H02M 7/5387*     (2007.01)
    *H02P 29/024*     (2016.01)

(56)     References Cited

U.S. PATENT DOCUMENTS

| | | | |
|---|---|---|---|
| 2014/0021973 A1 | 1/2014 | Kusaka | |
| 2014/0320056 A1* | 10/2014 | Royak | H02M 1/126 |
| | | | 318/504 |
| 2016/0336792 A1 | 11/2016 | Terazono | |
| 2017/0003337 A1 | 1/2017 | Bito et al. | |
| 2020/0235692 A1* | 7/2020 | Murata | H02P 27/08 |
| 2021/0013824 A1* | 1/2021 | Mieda | H02M 7/5395 |

FOREIGN PATENT DOCUMENTS

| | | | |
|---|---|---|---|
| JP | 5829986 B2 | 12/2015 | |
| JP | 5959457 B2 | 8/2016 | |
| JP | 2017-017822 A | 1/2017 | |
| JP | WO 2015-125279 A1 | 3/2017 | |

OTHER PUBLICATIONS

Office Action received in Korean Patent Application No. 10-2022-0131163 dated Oct. 15, 2024 in 33 pages.

* cited by examiner

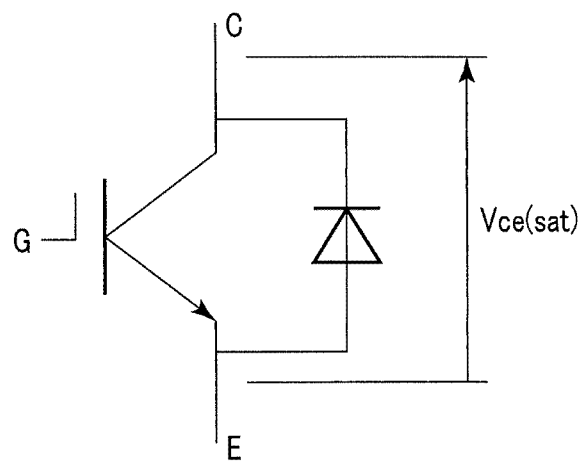
F I G. 2
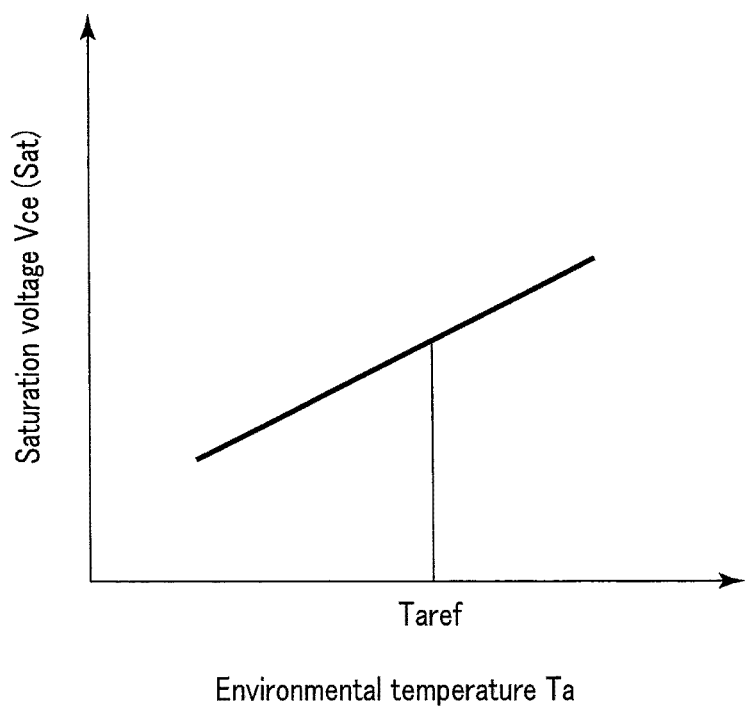
F I G. 3

| Target voltage pattern | γ1 | γ2 | γ3 | γ4 | γ5 | γ6 |
|---|---|---|---|---|---|---|
| Target voltage value (U-phase) | Vq | Vq/2 | -Vq/2 | -Vq | -Vq/2 | Vq/2 |
| Target voltage value (V-phase) | -Vq/2 | Vq/2 | Vq | Vq/2 | -Vq/2 | -Vq |
| Target voltage value (W-phase) | -Vq/2 | -Vq | -Vq/2 | Vq/2 | Vq | Vq/2 |

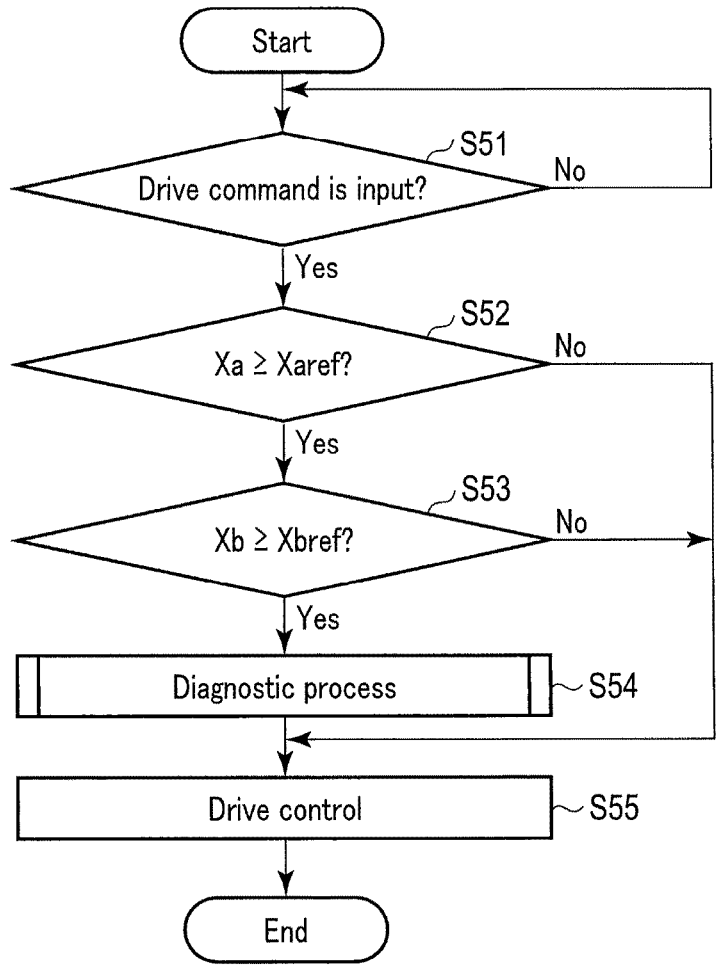
F I G. 12

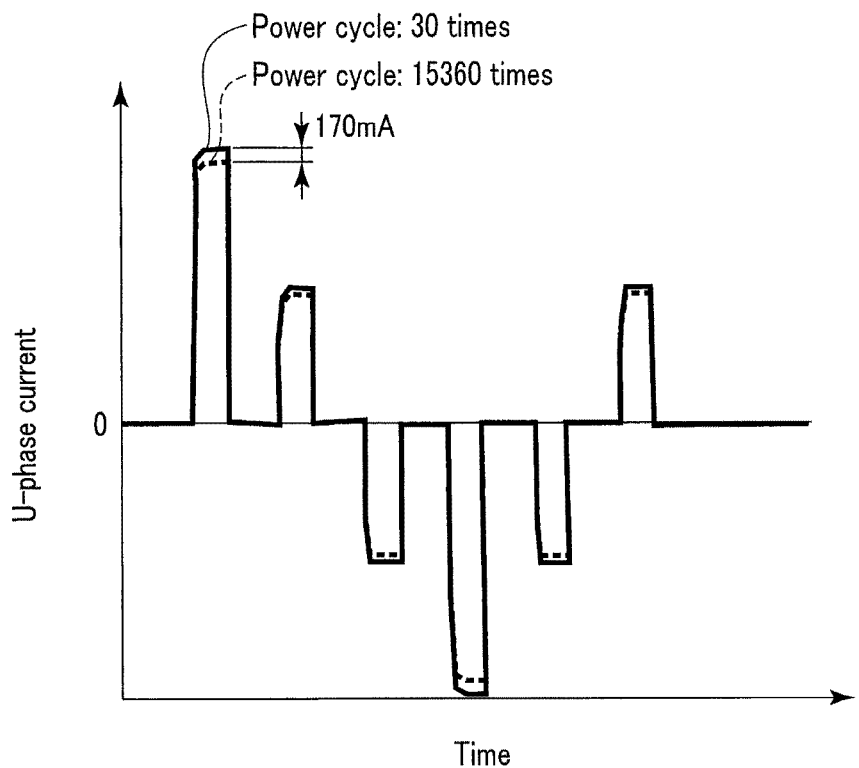
F I G. 14
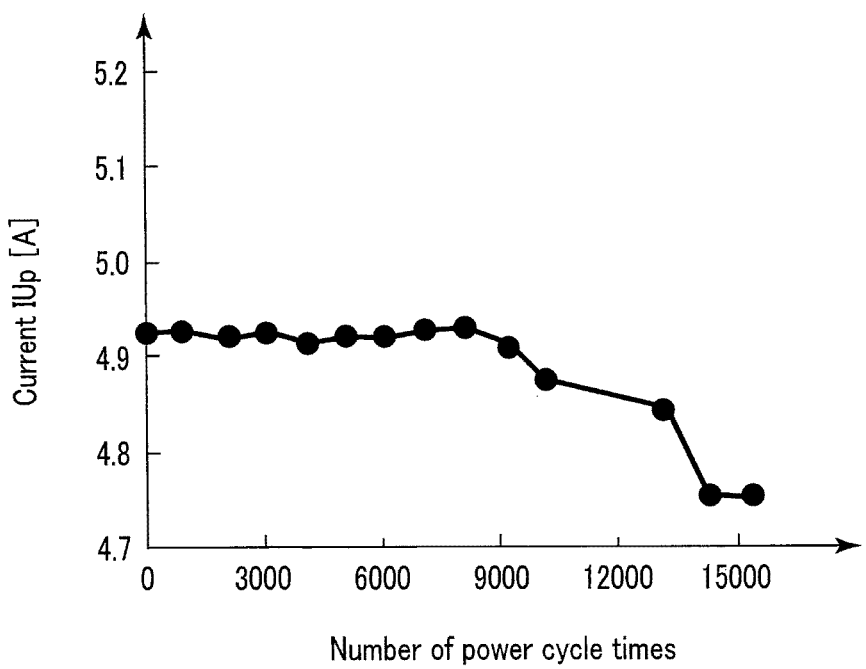
F I G. 15

DIAGNOSTIC APPARATUS, DIAGNOSTIC SYSTEM AND DIAGNOSTIC METHOD OF ELECTRIC POWER CONVERTER AND NON-TRANSITORY STORAGE MEDIUM

CROSS-REFERENCE TO RELATED APPLICATION

This application is based upon and claims the benefit of priority from Japanese Patent Application No. 2022-018092, filed Feb. 8, 2022; the entire contents of which are incorporated herein by reference.

FIELD

An embodiment relates to a diagnostic apparatus, a diagnostic system and a diagnostic method of an electric power converter and a non-transitory storage medium.

BACKGROUND

In a drive control for an electric motor, DC electric power is converted into plural-phase AC electric power such as three-phase AC electric power in an electric power converter in which an inverter circuit is formed, and the converted plural-phase AC electric power is output from the electric power converter to the electric motor. At this time, the respective operations of a plurality of semiconductor elements provided in the electric power converter are controlled by a drive control apparatus and the like, whereby the output from the electric power converter to the electric motor is controlled to control the drive of the electric motor. In a system in which the drive control for the electric motor is performed as described above, a degradation state and lifetime of each of the semiconductor elements are determined, and so on, whereby the electric power converter is diagnosed. In a certain example, a short-circuit current that does not flow through the electric motor is generated in the electric power converter, and based on the generated short-circuit current, the degradation state and the like of the semiconductor element are determined.

Herein, in the electric power converter, an allowed time while the above-mentioned short-circuit current is flowable is severely restricted. Therefore, it is required that the electric power converter be diagnosed without generating the short-circuit current in the electric power converter. Then, in the diagnosis for the electric power converter, it is required that the degradation state and the like of the semiconductor element provided in the electric power converter be appropriately determined without generating the short-circuit current in the electric power converter.

BRIEF DESCRIPTION OF THE DRAWINGS

FIG. 2 is a schematic diagram explaining characteristics of a semiconductor element provided in an electric power converter that outputs electric power to the electric motor.

FIG. 3 is a schematic diagram showing an example of a relationship between an environmental temperature and a saturation voltage in the semiconductor element in a state in which the semiconductor element is not energized for a long time.

FIG. 12 is a flowchart schematically showing an example of a process performed by a processor and the like in a diagnostic apparatus according to the embodiment.

FIG. 14 is a schematic diagram showing a change over time of a U-phase current that flows through the electric motor in a state in which such constant voltage outputs are sequentially performed in the six target voltage pattern at two diagnostic times different from each other in a first verification.

FIG. 15 is a schematic diagram showing, as a verification result in the first verification, a relationship between the number of power cycle times and the U-phase current that flows through the electric motor in a constant voltage output in a corresponding target voltage pattern.

DETAILED DESCRIPTION

According to an embodiment, a diagnostic apparatus of an electric power converter is provided, and the electric power converter outputs a converted AC electric power to an electric motor, thereby driving the electric motor. The diagnostic apparatus includes an output control unit and a degradation determination unit. The output control unit controls operations of a plurality of semiconductor elements of the electric power converter, thereby allowing output of electric power from the electric power converter to the electric motor by constant voltage output, which constantly sets an output voltage to the electric motor in a target voltage pattern. The degradation determination unit determines a degradation state for at least one of the semiconductor elements based on a current that flows through the electric motor in the constant voltage output from the electric power converter to the electric motor.

An embodiment and the like will be described below with reference to the drawings.

(Configuration of Drive Control for Electric Motor)

Figure 1:
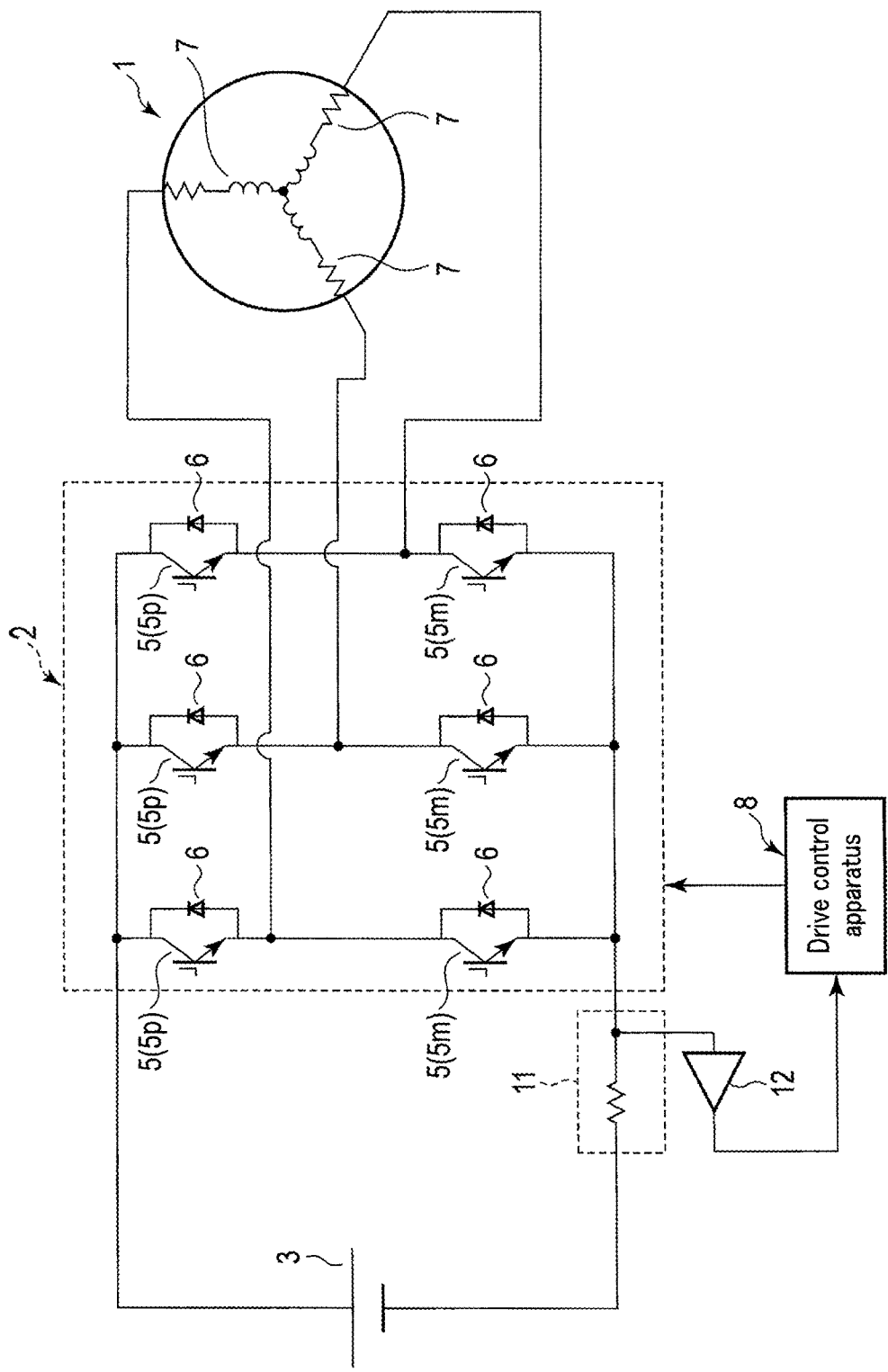
FIG. 1 is a schematic diagram showing an example of a configuration of controlling a drive of an electric motor.

First, as an item that relates to the embodiment and the like, a configuration of controlling a drive of the electric motor will be described. FIG. 1 shows an example of the configuration of controlling the drive of the electric motor. In the example of FIG. 1, a drive of an electric motor 1 that is a three-phase synchronous electric motor is controlled. A system that controls the drive of the electric motor 1 is provided with an electric power converter 2 that is an inverter. The electric power converter 2 is supplied with DC electric power from a DC electric power source 3 that is a driving electric power source. The electric power converter 2 includes a plurality of semiconductor elements 5 such as insulated gate bipolar transistors (IGBTs). In the electric power converter 2, plural-phase half bridge circuits are formed by the semiconductor elements 5, and each of the half bridge circuits is provided with two semiconductor elements 5 which are a positive-side semiconductor element 5p and a negative-side semiconductor element 5m. The plural-phase half bridge circuits are connected in electrically parallel to one another between a positive-side electric power source line and a negative-side electric power source line. In the example of FIG. 1, six semiconductor elements 5 are provided, and three-phase half bridge circuits are formed in electrically parallel to one another.

In each of the semiconductor elements 5 provided in the electric power converter 2, a free-wheel diode 6 is connected between a collector and an emitter. Each of the free-wheel diodes 6 is connected in electrically parallel to one of the semiconductor elements 5, which corresponds thereto. Moreover, in each of the half bridge circuits, an output terminal is formed between the positive-side semiconductor element 5p and the negative-side semiconductor element 5m, and the electric motor 1 is provided with windings (stator windings) 7 of which number is the same as the number of phases of the half bridge circuits. The output terminal of each of the half bridge circuits is connected to one of the windings 7 of the electric motor 1, which corresponds thereto, and in the example of FIG. 1, and the output terminal of each of the three-phase (U-phase, V-phase and W-phase) half bridge circuits is connected to one of the three windings 7, which corresponds thereto.

The system that controls the drive of the electric motor 1 is provided with a drive control apparatus 8. The drive control apparatus 8 controls an operation of the electric power converter 2, thereby controlling the drive of the electric motor 1. On the drive control apparatus 8, an integrated circuit including a processor, a non-transitory storage medium and the like is mounted. The processor of the integrated circuit includes a central processing unit (CPU), an application specific integrated circuit (ASIC), a field programmable gate array (FPGA) or the like. In the drive control apparatus 8, the processor executes a program stored in the storage medium and the like, thereby controlling the operation of the electric power converter 2. The drive control apparatus 8 controls ON and OFF timing of each of the semiconductor elements 5, and so on, and controls an operation of each of the semiconductor elements 5, thereby controlling the operation of the electric power converter 2. Moreover, using a pulse signal such as a pulse width modulation (PWM) signal, the drive control apparatus 8 controls ON and OFF timing and the like of each of the semiconductor elements 5. In each of the semiconductor elements 5, the pulse signal from the drive control apparatus 8 is input, for example, to a gate.

The operation of the electric power converter 2 is controlled by the drive control apparatus 8, whereby the electric power converter 2 converts DC electric power from the DC electric power source 3 into plural-phase AC electric power. In the example of FIG. 1, DC electric power is converted into three-phase AC electric power. The electric power converter 2 outputs the converted plural-phase AC electric power to the electric motor 1, thereby driving the electric motor 1 to rotate a rotor of the electric motor 1, and so on. In a state in which the electric motor 1 is driven, plural-phase AC voltages different in phase from one another are output as output voltages from the electric power converter 2 to the electric motor 1. In the example of FIG. 1, three-phase (U-phase, V-phase and W-phase) of AC voltages are output in phases different from one another from the electric power converter 2 to the electric motor 1. Then, the phase of the U-phase AC voltage is shifted by 120° with respect to the phase of each of the V-phase AC voltage and the W-phase AC voltage, and the phase of the V-phase AC voltage is shifted by 120° with respect to the phase of the W-phase AC voltage. Note that, in a state in which the electric motor 1 is driven by supply of the plural-phase AC electric power, the output voltage from the electric power converter 2 to the electric motor 1, that is, a voltage application state in the electric motor 1 changes over time with a cycle of the AC electric power taken as a cycle thereof.

Moreover, in the example of FIG. 1, a current detection circuit 11 is provided. The current detection circuit 11 detects a current that flows through the electric motor 1 in the state in which the electric motor 1 is driven by the supply of the plural-phase (three-phase) AC electric power. In the example of FIG. 1, the current detection circuit 11 includes a shunt resistor disposed at a spot in the negative-side electric power source line of the electric power converter 2, and based on a voltage of the shunt resistor, detects the current that flows through the electric motor 1. In a certain example, in each of the plural-phase (three-phase) half bridge circuits, the shunt resistor is disposed between the negative-side semiconductor element 5m and the negative-side electric power source line, and in the electric power converter 2, the shunt resistors are arranged at a plurality of spots (three spots). Then, based on a voltage of each of a plurality of shunt resistors, the current detection circuit detects the current that flows through the electric motor 1.

Moreover, in the example of FIG. 1, an analog signal that indicates a detection result of the current in the current detection circuit 11 is amplified by an amplifier 12, and the amplified analog signal is transmitted to the drive control apparatus 8. In the drive control apparatus 8, the analog signal that indicates the detection result of the current is converted into a digital signal using an analog to digital (A/D) converter. Thus, the drive control apparatus 8 acquires such a digital signal that indicates the detection result of the current that flows through the electric motor 1. Based on the detection result of the current that flows through the electric motor 1, the drive control apparatus 8 generates the pulse signal such as a PWM signal that controls the operation of each of the semiconductor elements 5, and controls the operation of each of the semiconductor elements 5 using the generated pulse signal. Thus, each of the plural-phase (three-phase) output voltages is controlled based on the detection result of the current that flows through the electric motor 1, and the like. In a certain example, the drive control apparatus 8 performs a PI control for the current that flows through the electric motor 1, thereby adjusting a magnitude and the like of each of the plural-phase output voltages to the electric motor 1.

In the system that controls the drive of the electric motor 1 as mentioned above, each of the semiconductor elements 5 of the electric power converter 2 repeats ON and OFF in a short cycle. Therefore, in each of the semiconductor elements 5, self-heat generation at an ON time and cooling at an OFF time are repeatedly caused. The self-heat generation and the cooling are repeatedly caused as mentioned above in each of the semiconductor elements 5. Accordingly, for each of the semiconductor elements 5, it is necessary to appropriately determine the degradation state by appropriately determining such an occurrence of a crack at a connection portion of members different in thermal expansion coefficient from each other, and so on. Then, it is necessary to appropriately diagnose the electric power converter 2 by appropriately determining the degradation state of each of the semiconductor elements 5.

(Item that Relates to Determination for Degradation State of Semiconductor Element)

A description will be given below of an item that relates to a determination of a degradation state of a semiconductor element such as the semiconductor element 5 for use in the above-mentioned electric power converter 2. In FIG. 2, a parameter that indicates characteristics of the semiconductor element is shown. In FIG. 2, as the parameter that indicates the characteristics of the semiconductor element, a saturation voltage Vce(sat) between a collector and an emitter is shown. In the following description, the saturation voltage Vce(sat) between the collector and the emitter will be simply referred to as a "saturation voltage". In a semiconductor element such as an IGBT, a saturation voltage rises as a degree of degradation rises. However, in the semiconductor element, a difference between a saturation voltage in a state in which the degree of degradation is high and a saturation voltage in a state in which the semiconductor element is not degraded is small. In a semiconductor element in a certain example, a difference between a saturation voltage in a state in which a power cycle under a predetermined condition is performed 16000 times (16000 cycles) and a saturation voltage in a state before the power cycle is performed is approximately 100 mV (0.1 V). Hence, in the determination of the degradation state of the semiconductor element, it is necessary to appropriately detect a small change of the saturation voltage between the state in which the degree of degradation is high and the state in which the semiconductor element is not degraded.

Moreover, in the semiconductor element such as an IGBT, the above-mentioned saturation voltage changes according to a temperature of a joint surface of a component of the semiconductor element to a chip, that is, a junction temperature Tj. In a certain example, when the junction temperature changes by 50° C., the saturation voltage of the semiconductor element changes by 0.14 V. In this case, a variation of the saturation voltage, which is caused by the change of the junction temperature, reaches approximately the same magnitude as the difference of the saturation voltage between the state in which the degree of degradation is high and the state in which the semiconductor element is not degraded. Therefore, in the case of determining the degradation state of the semiconductor element based on the saturation voltage, it is necessary to consider an influence of the junction temperature Tj. The junction temperature Tj is calculated as in Equation (1) using an environmental temperature Ta of an environment where the semiconductor element is disposed, a heat resistance Rth(ja) between the joint surface (junction) to the chip and the environment where the semiconductor element is disposed, and electric power P supplied to the semiconductor element.

$$Tj = Ta + Rth(ja) \times P \quad (1)$$

However, the heat resistance Rth(ja) changes according to a time while a voltage is applied to the semiconductor element. Moreover, in such a state in which the electric motor is driven by the supply of the electric power from the electric power converter, each of the semiconductor elements repeats ON and Off in a short time as mentioned above. Therefore, in each of the semiconductor elements, an energized state and an unenergized state are repeatedly switched in a short time. Therefore, in such a state in which the electric motor is driven by the supply of the electric power from the electric power converter, it is difficult to appropriately grasp an influence of the electric power, which is supplied to the semiconductor element, to the heat resistance Rth(ja), and it is difficult to appropriately calculate the heat resistance Rth(ja). Hence, it is difficult to calculate the junction temperature Tj in consideration of the heat resistance Rth(ja).

Herein, in such a state in which the semiconductor element is not energized for a long time as a state in which the electric motor is not driven for a long time, it can be regarded that the junction temperature of the semiconductor element coincides with the environmental temperature of the environment where the semiconductor element is disposed, that is, an environmental temperature of the electric power converter. Therefore, with regard to such a state in which the semiconductor element is not energized for a long time, it is possible to correct the detected saturation voltage of the semiconductor element using the environmental temperature of the semiconductor element in place of the junction temperature. For example, in such a state of determining the degradation state of the semiconductor element immediately before the drive of the electric motor is started, it is possible to correct the detection result of the saturation voltage of the semiconductor element using the environmental temperature of the semiconductor element.

FIG. 3 shows an example of a relationship between the environmental temperature Ta and the saturation voltage Vce(sat) in the semiconductor element in the state in which the semiconductor element is not energized for a long time. In FIG. 3, the environmental temperature Ta of the semiconductor element (electric power converter) is shown on an abscissa axis, and the saturation voltage Vce(sat) is shown on an ordinate axis. In the state in which the semiconductor element is not energized for a long time, then based on the relationship in the example of FIG. 3 and a detection result of the environmental temperature Ta, it is possible to correct a detected saturation voltage to a saturation voltage in an environment where the environmental temperature Ta reaches a reference temperature Taref. Herein, the reference temperature Taref is 20° C. for example.

Figure 4:
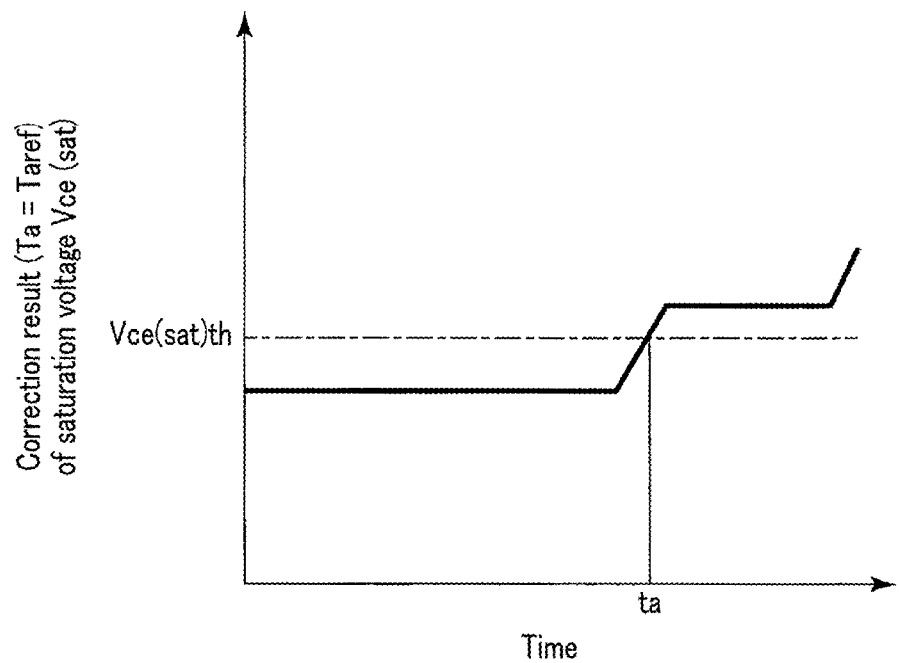
FIG. 4 is a schematic diagram showing an example of a change over time of a correction result (conversion result) to the saturation voltage of the semiconductor element in a state in which the environmental temperature is a reference temperature.

Moreover, in the case of determining the degradation state of the semiconductor element in the state in which the semiconductor element is not energized for a long time, then based on a correction result to the saturation voltage in a state in which the environmental temperature Ta is the reference temperature Taref, it is possible to determine the degradation state of the semiconductor element such as to whether a failure of the semiconductor element has occurred. FIG. 4 shows an example of a change over time of the correction result (conversion result) to the saturation voltage of the semiconductor element in a state in which the environmental temperature Ta is the reference temperature Taref. In FIG. 4, a time with a starting time of use of the semiconductor element (electric power converter) taken as a reference is shown on an abscissa axis, and the correction result to the saturation voltage at the reference temperature Taref is shown on an ordinate axis. In the example of FIG. 4, at a time ta, the correction result to the saturation voltage at the reference temperature Taref exceeds a threshold Vce(sat)th. Therefore, it is determined that the failure or the like has occurred in the semiconductor element on and after the time ta.

Figure 5:
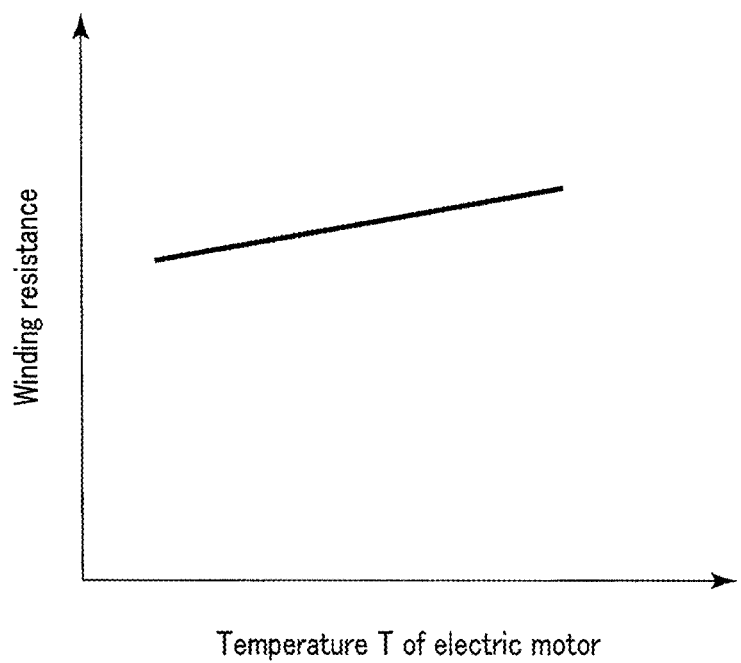
FIG. 5 is a schematic diagram showing an example of temperature characteristics of a winding resistance of the electric motor.

Moreover, in the electric power converter that drives the electric motor, as mentioned above, each of the plural-phase half bridge circuits is connected to the corresponding one of the windings of the electric motor, and each of the semiconductor elements is connected to the corresponding one of the windings of the electric motor. Therefore, the above-mentioned saturation voltage of each of the semiconductor elements is affected by connected one of the windings of the electric motor. Each of the windings of the electric motor has a winding resistance, and the winding resistance of each of the windings changes according to the temperature of the electric motor. FIG. 5 shows an example of temperature characteristics of the winding resistance of the electric motor. In FIG. 5, the temperature T of the electric motor is shown on an abscissa axis, and the winding resistance of the winding of the electric motor is shown on an ordinate axis. As shown in the example of FIG. 5, and the like, the winding resistance of the electric motor rises as the temperature rises. Moreover, in a certain example, it is possible to calculate a winding resistance $R_T$ of the winding at the temperature T of the electric motor in such a manner as in Equation (2). In Equation (2), a winding resistance $R_{Tref}$ in the case where the electric motor reaches the reference temperature Tref is prescribed, and in addition, an inclination $\alpha_T$ of the winding resistance $R_T$ with respect to the temperature T is prescribed.

$$R_T = R_{Tref}\{1 + \alpha_T(T - Tref)\} \quad (2)$$

In a certain example, the winding resistance becomes 1.70Ω at 20° C. that is the reference temperature Tref of the electric motor. Then, from a calculation result based on Equation (2) and the like, a winding resistance when the temperature of the electric motor is 100° C. becomes 2.24Ω. In this case, if the current that flows through the electric motor is set to 5 A, then by the fact that the temperature of the electric motor changes from 20° C. to 100° C., a voltage applied to the winding resistance of the electric motor changes from 8.5 V to 11.2 V, that is, changes by approximately 3 V. Therefore, a variation of the voltage applied to the winding resistance, the variation being caused by the change of the temperature of the electric motor, increases as compared with the difference of the saturation voltage between the state in which the degree of degradation is high and the state in which the semiconductor element is not degraded. From the above, in the case of determining the degradation state for the semiconductor element of the electric power converter based on the saturation voltage, it is important to consider the influence of the winding resistance of the electric motor to the saturation voltage of the semiconductor element.

Moreover, as mentioned above, each of the semiconductor elements of the electric power converter is connected to the corresponding one of the windings of the electric motor. Therefore, from the fact that the current that flows through the winding connected to each of the semiconductor elements reaches such a saturation state, it becomes possible to detect the saturation voltage of each of the semiconductor elements. In a certain example, in the winding of the electric motor, which is connected to the semiconductor element, the winding resistance becomes 1.7Ω, and an inductance becomes 0.027 H. In this case, a time constant of the winding becomes 0.016 s. In an electric motor of which drive is controlled, a time constant of a winding does not differ largely from that in the above-mentioned example. Therefore, in the electric motor, energization for approximately 0.1 s causes the saturation state of the current that flows through the winding. Hence, a current is flown continuously for approximately 0.1 s through the semiconductor element and the winding connected thereto, thus making it possible to detect the saturation voltage of the semiconductor element.

It is possible to detect the saturation voltage of the semiconductor element by the energization for approximately 0.1 s, and therefore, it becomes possible to shorten the time of energizing the semiconductor element in the detection of the saturation voltage of the semiconductor element. Such an energization time of the semiconductor element is shortened, whereby a rise of the junction temperature of the semiconductor element due to the energization is suppressed in the detection of the saturation voltage. Thus, it is regarded that the environmental temperature of the semiconductor element (electric power converter) and the junction temperature coincide with each other, and it becomes possible to execute the determination of the degradation state and the like of the semiconductor element, the determination being based on the above-mentioned saturation voltage.

In such a system that controls the drive of the electric motor, it is possible to detect the above-mentioned change of the saturation voltage of the semiconductor element by using the output voltage from the electric power converter to the electric motor in the control of setting, to a target state, the current that flows through the electric motor. For example, it is possible to detect the saturation voltage of each of the semiconductor elements of the electric power converter by using the output voltage from the electric power converter to the electric motor in the PI control for the current that flows through the electric motor. However, in such a control to set the current that flows through the electric motor to the target state, it is necessary to detect a current that flows through the electric motor in real time, and the like. Therefore, in the case of detecting the saturation voltage of each of the semiconductor elements in the control to set the current that flows through the electric motor to the target state, detection accuracy of the current is largely affected, which gives a large influence to the control for the current.

Figure 6:
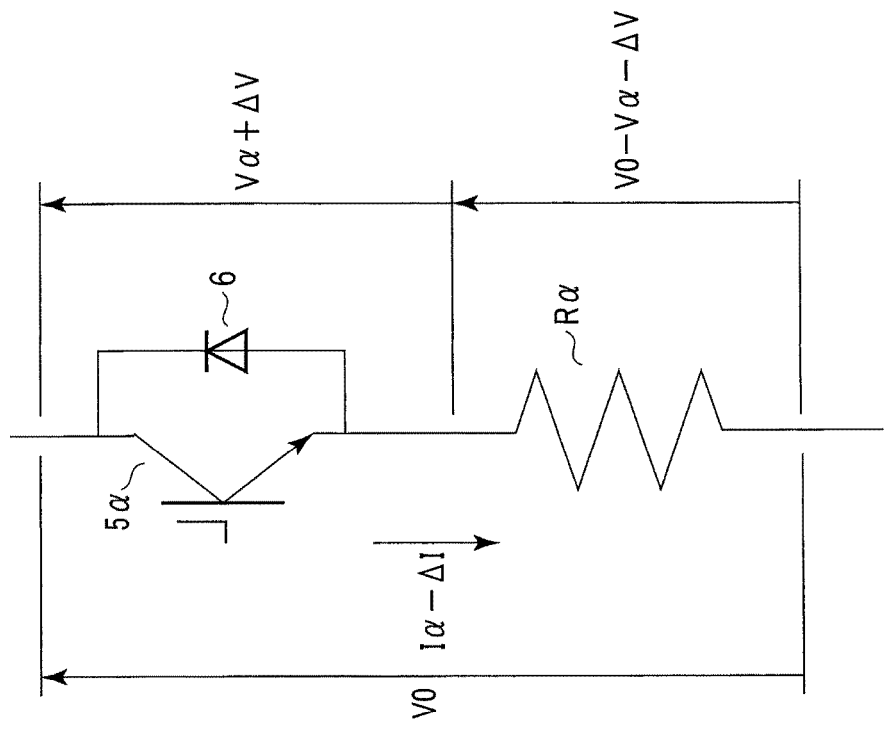
FIG. 6 is a schematic diagram explaining a change of a current that flows through the electric power converter and the electric motor in an output that constantly sets each of plural-phase output voltages to a fixed voltage value, the change being caused by degradation of the semiconductor element.
Figure 6:
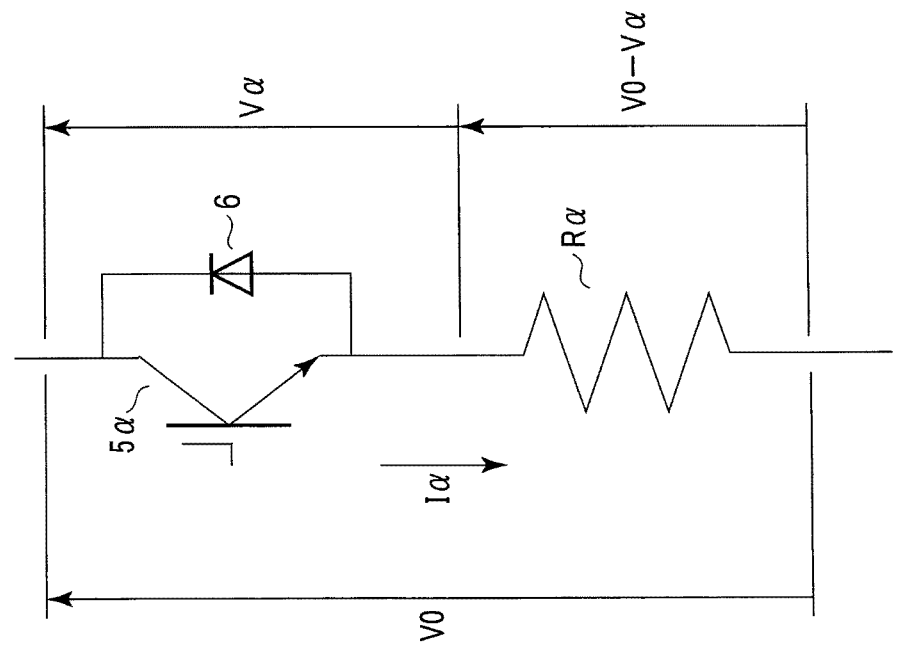

Moreover, it is possible to detect the above-mentioned change of the saturation voltage of the semiconductor element by using a current that flows through the electric motor in a state in which each of the plural-phase output voltages from the electric power converter to the electric motor is constant over time at a fixed voltage value. Herein, if each of the plural-phase output voltages from the electric power converter to the electric motor is constant at the fixed voltage value, when the saturation voltage rises in a certain semiconductor element due to the degradation, then the current that flows through the degraded semiconductor element and the winding (winding resistance) connected to the degraded semiconductor element decreases. FIG. 6 shows a change of the current that flows through the electric power converter and the electric motor in an output that constantly sets each of the plural-phase output voltages to the fixed voltage value, the change being caused by degradation of the semiconductor element. In FIG. 6, for a certain phase among the plural phases, a semiconductor element $5\alpha$ that is one of two semiconductor elements 5 and a winding resistance $R\alpha$ of the winding of the electric motor are shown.

In the output that constantly sets each of the output voltages from the electric power converter to the electric motor at the fixed voltage value, in each of the plural phases, the voltage applied across a corresponding one of two semiconductor elements and the winding resistance of the electric motor becomes constant at the fixed voltage value. At this time, in the one phase shown in FIG. 6, such a voltage with the fixed voltage value V0 is applied across the semiconductor element $5\alpha$ and the winding resistance $R\alpha$. In a state in which the semiconductor element $5\alpha$ is not degraded, in the above-mentioned output that constantly sets each of the output voltages to the electric motor at the fixed voltage value, the saturation voltage of the semiconductor element $5\alpha$ becomes $V\alpha$, and the voltage applied to the winding resistance $R\alpha$ becomes $V0-V\alpha$. Then, a current that flows through the semiconductor element $5\alpha$ and the winding resistance $R\alpha$ becomes $I\alpha$.

Meanwhile, in a state in which a degree of degradation of the semiconductor element $5\alpha$ is high, the saturation voltage of the semiconductor element $5\alpha$ rises with respect to the state in which the semiconductor element $5\alpha$ is not degraded. Moreover, even in the state in which the degree of degradation of the semiconductor element $5\alpha$ is high, in the output that constantly sets each of the output voltages from the electric power converter to the electric motor at the fixed voltage value, the voltage with the fixed voltage value V0 is applied across the semiconductor element $5\alpha$ and the winding resistance $R\alpha$. Therefore, in the state in which the degree of degradation of the semiconductor element $5\alpha$ is high, in the above-mentioned output that constantly sets each of the output voltages to the electric motor at the fixed voltage value, the saturation voltage of the semiconductor element $5\alpha$ becomes $V\alpha+\Delta V$, and the voltage applied to the winding resistance $R\alpha$ becomes $V0-V\alpha-\Delta V$. When the semiconductor element $5\alpha$ is degraded, the voltage applied to the winding resistance $R\alpha$ decreases to $V0-V\alpha-\Delta V$ as mentioned above, and therefore, the current that flows through the semiconductor element $5\alpha$ and the winding resistance $R\alpha$ decreases to $I\alpha-\Delta I$.

As described above, based on the current that flows through the electric motor in the output of the electric power from the electric power converter that constantly sets each of the plural-phase output voltages to the electric motor at the fixed voltage value, it becomes possible to detect the change of the current, which corresponds to the change of the saturation voltage of each of the semiconductor elements of the electric power converter, and it becomes possible to determine the degradation state of the semiconductor element. Herein, it is assumed that a resistance value of the above-mentioned winding resistance $R\alpha$ is $1.7\Omega$, and it is assumed that the fixed voltage value V0 applied across the semiconductor element $5\alpha$ and the winding resistance $R\alpha$ is 10 V. Then, it is assumed that the saturation voltage of the semiconductor element $5\alpha$ rises from 1.5 V to 1.6 V due to the degradation of the semiconductor element $5\alpha$. In this case, the current that flows through the semiconductor element $5\alpha$ and the winding resistance $R\alpha$ in the output that constantly sets each of the output voltages to the electric motor at the fixed voltage value decreases from 5.00 A in the state in which the semiconductor element $5\alpha$ is not degraded to 4.94 A in the state in which the degree of degradation is high, and changes by approximately 0.06 A. In the determination of the degradation state of each of the semiconductor elements of the electric power converter that outputs electric power to the electric motor, the semiconductor elements including the semiconductor element $5\alpha$, it is necessary to appropriately detect the above-mentioned current change of approximately 0.06 A.

In a certain example, in such a system that controls the drive of the electric motor, a resolution of the detected current is determined by a maximum current detectable in the system, and by the number of bits of an A/D converter that converts an analog signal of the detected current into a digital signal. For example, it is assumed that the maximum current detectable in the system is 37.5 A, and that the number of bits of the A/D converter is 12. In this case, the resolution of the detected current becomes 0.018 A. Therefore, if the change of the current, which is caused by the degradation of the semiconductor element, is approximately 0.06 A as mentioned above, then it is theoretically possible to detect the change of the current, which is caused by the degradation of the semiconductor element.

However, a few lower-level bits in the A/D converter are affected by an error in the conversion to the digital signal. Therefore, in the case of detecting the change of the current, which is approximately 0.06 A, it is necessary to input the analog signal of the detected current to the A/D converter after amplifying the same at a high amplification rate, and to increase the resolution of the detected current. Hence, in the case of detecting the change of the current, which is caused by the degradation of the semiconductor element, then in comparison with such detection of the current in the state in which the electric motor is driven by the supply of the AC electric power, it is necessary to amplify the analog signal of the detected current at a high amplification rate, and to input the amplified analog signal to the A/D converter.

(Diagnostic Apparatus, Diagnostic System, Diagnostic Method and Diagnostic Program)

Figure 7:
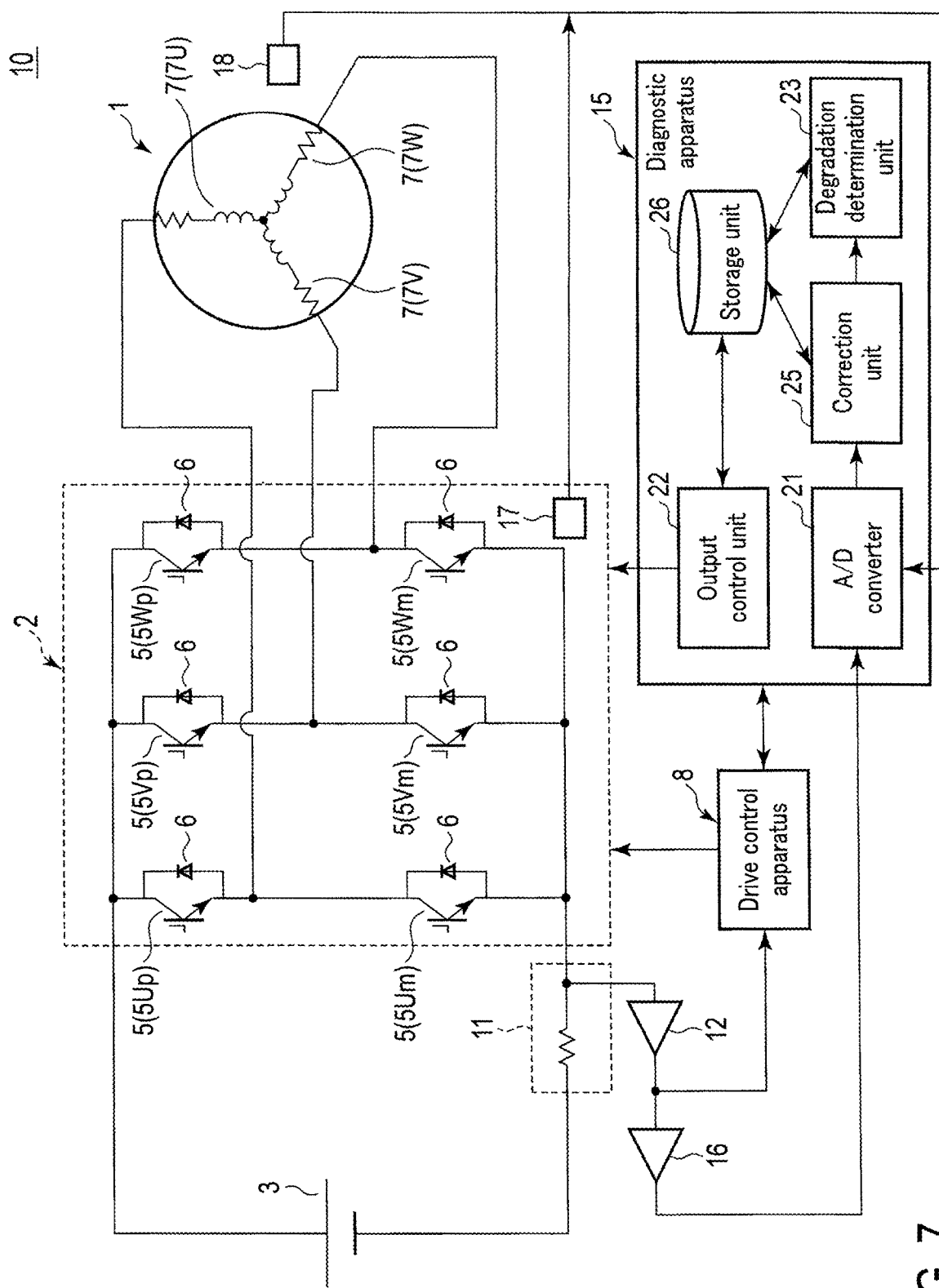
FIG. 7 is a schematic diagram showing an example of a diagnostic system of an electric power converter according to an embodiment.

In consideration of the above-mentioned item and the like, a description will be given below of a diagnostic apparatus, a diagnostic system, a diagnostic method and a diagnostic program according to an embodiment. In the embodiment, a degradation state of a plurality of semiconductor elements of an electric power converter is determined in the following manner. FIG. 7 shows a diagnostic system 10 as an example of the diagnostic system for the electric power converter according to the embodiment. As in the example of FIG. 1, the diagnostic system 10 of FIG. 7 includes an electric motor 1, an electric power converter 2, a DC electric power source 3, a drive control apparatus 8, a current detection circuit 11 and an amplifier 12, in which, in the electric power converter 2 that serves as an inverter, three-phase (plural-phase) half bridge circuits are formed of six semiconductor elements 5. Then, as in the example of FIG. 1, in the electric power converter 2, each of free-wheel diodes 6 is connected in electrically parallel to one of the semiconductor elements 5, which corresponds thereto, and an output terminal of each of the three-phase half bridge circuits is connected to one of three windings (stator windings) 7 of the electric motor 1, which corresponds thereto. In the present embodiment also, as in such an example of FIG. 1, the drive control apparatus 8 controls an operation of the electric power converter 2, thereby controlling an output voltage from the electric power converter 2 to the electric motor 1, and the like to control the drive of the electric motor 1.

Moreover, in the present embodiment shown in FIG. 7, the diagnostic system 10 includes a diagnostic apparatus 15, an amplifier 16 and temperature sensors 17 and 18. The diagnostic apparatus 15 includes an A/D converter 21, an output control unit 22, a degradation determination unit 23, a correction unit 25 and a storage unit 26. The diagnostic apparatus 15 performs diagnosis for the electric power converter 2, and determines a degradation state and the like, for example, for each of the plurality of semiconductor elements 5 of the electric power converter 2. In the diagnostic apparatus 15, an analog signal is input to the A/D converter 21, and the analog signal is converted into a digital signal in the A/D converter 21. Herein, for example, the number of bits of the A/D converter 21 is the same as the number of bits of the A/D converter mounted on the drive control apparatus 8.

On the diagnostic apparatus 15, an integrated circuit including a processor, a non-transitory storage medium and the like is mounted. In the diagnostic apparatus 15 also, the processor of the integrated circuit includes, a CPU, an ASIC, an FPGA or the like. Then, in the diagnostic apparatus 15, the processor executes such a program stored in the storage medium and the like, thereby executing a process regarding the diagnosis for the electric power converter 2. In the diagnostic apparatus 15, each of the output control unit 22, the degradation determination unit 23 and the correction unit 25 executes a part of a process of the processor and the like, and the storage unit 26 functions as a non-transitory storage medium.

In the diagnostic apparatus 15, the output control unit 22 controls an operation of each of the semiconductor elements 5 of the electric power converter 2, and controls an output of electric power from the electric power converter 2 to the electric motor 1. In the diagnosis using the diagnostic apparatus 15, the output control unit 22 controls the operation of the electric power converter 2, thereby allowing the output of electric power from the electric power converter 2 to the electric motor 1 by the constant voltage output that constantly sets the output voltages to the electric motor 1 in the target voltage patterns. In the constant voltage output from the electric power converter 2 to the electric motor 1, the three-phase (plural-phase) output voltages from the electric power converter 2 to the electric motor 1, that is, application states of the voltages in the electric motor 1 become constant or substantially constant over time. Hence, in the constant voltage output of the electric motor 1, each of the three-phase (U-phase, V-phase and W-phase) output voltages becomes constant or substantially constant at the target voltage value (fixed voltage value). Note that, as in the drive control apparatus 8 and the like, the output control unit 22 inputs a pulse signal to a gate of each of the semiconductor elements 5, and so on, and controls the operation of each of the semiconductor elements 5.

In the present embodiment, in the diagnosis for the electric power converter 2, the output control unit 22 allows sequential execution of the constant voltage outputs, each of which constantly sets the output voltage to the electric motor 1 in the target voltage pattern, in a plurality of the target voltage patterns. In the plurality of target voltage patterns, such application states of the output voltages from the electric power converter 2 in the electric motor 1 differ from one another. Hence, between the plurality of target voltage patterns, in at least one phase among the three phases (plural phases), the target voltage value (fixed voltage value) of the output voltage from the electric power converter 2 to the electric motor 1 differs from those of others. Preferably, the number of patterns of the target voltage patterns, in each of which the constant voltage output that constantly sets the output voltage to the electric motor 1 is performed, is equal to or more than the number of semiconductor elements 5 provided in the electric power converter 2. In the example of FIG. 7 and the like, in the diagnosis for the electric power converter 2, the constant voltage output is performed from the electric power converter 2 to the electric motor 1 in each of six target voltage patterns $\gamma 1$ to $\gamma 6$ of which number is the same as the number of semiconductor elements 5.

Figures 8, 9:
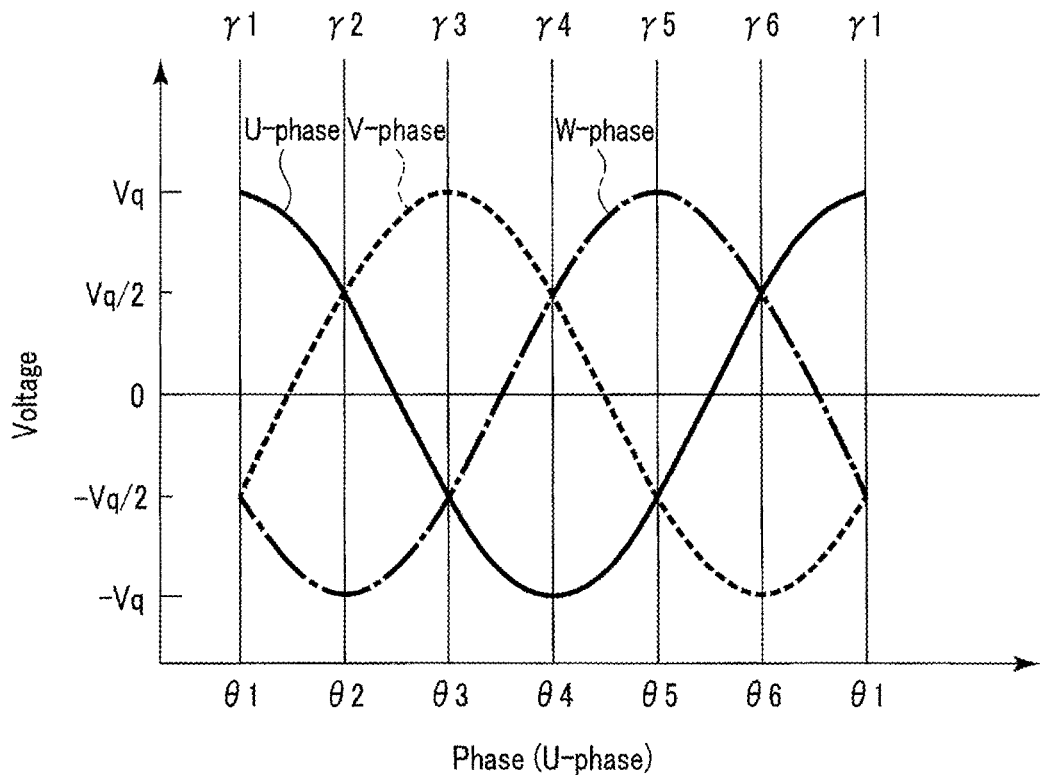
FIG. 8 is a schematic diagram explaining six target voltage patterns in which a constant voltage output to an electric motor is performed in a diagnosis for the electric power converter in the embodiment.
FIG. 9 is a schematic diagram showing target voltage values of three-phase output voltages for each of the six target voltage patterns in which the constant voltage output to the electric motor is performed in the diagnosis for the electric power converter in the embodiment.

Herein, referring to FIG. 8, a description will be given of the six target voltage patterns $\gamma 1$ to $\gamma 6$ in each of which the constant voltage output to the electric motor 1 is performed in the diagnosis. In FIG. 8, voltage waveforms of three phases (U-phase, V-phase and W-phase) of AC voltages are shown. As mentioned above, phases of the three-phase AC voltages are shifted by 120° from one another. In FIG. 8, an abscissa axis shows a phase of the U-phase AC voltage, and an ordinate axis shows a voltage. In the three-phase AC voltages in FIG. 8, the AC voltage of each of the U-phase, the V-phase and the W-phase changes periodically with a peak to peak value taken as $2Vq$.

When the six target voltage patterns $\gamma 1$ to $\gamma 6$ in each of which the constant voltage output is performed in the diagnosis and the three-phase of AC voltages in FIG. 8 are compared with each other, then in the target voltage pattern $\gamma 1$, a case where the U-phase AC voltage becomes a phase $\theta 1$ in the three-phase AC voltages in FIG. 8 and the application state of the voltage in the electric motor 1 coincide with each other. Moreover, with regard to a case where the U-phase AC voltage in the three-phase AC voltages in FIG. 8 becomes a phase $\theta 2$ in the target voltage pattern $\gamma 2$, a case where the U-phase AC voltage in the three-phase AC voltages in FIG. 8 becomes a phase $\theta 3$ in the target voltage pattern $\gamma 3$, a case where the U-phase AC voltage in the three-phase AC voltages in FIG. 8 becomes a phase $\theta 4$ in the target voltage pattern $\gamma 4$, a case where the U-phase AC voltage in the three-phase AC voltages in FIG. 8 becomes a phase $\theta 5$ in the target voltage pattern $\gamma 5$, and a case where the U-phase AC voltage in the three-phase AC voltages in FIG. 8 becomes a phase $\theta 6$ in the target voltage pattern $\gamma 6$, each thereof coincides with the application state of the voltage in the electric motor 1. Note that, in the U-phase AC voltage in FIG. 8, the phases $\theta 1$ to $\theta 6$ are shifted from one another by 60°.

FIG. 9 shows target voltage values of the three-phase output voltages for each of the six target voltage patterns $\gamma 1$ to $\gamma 6$ in each of which the constant voltage output to the electric motor 1 is performed. In the example of FIG. 7 and the like, performed is a control that constantly sets each of the three-phase output voltages at the target voltage value shown in FIG. 9 in each of the constant voltage outputs in the target voltage patterns $\gamma 1$ to $\gamma 6$. As shown in FIG. 9, the target voltage value of the U-phase output voltage is set at $Vq$ in the target voltage pattern $\gamma 1$, at $Vq/2$ in the target voltage pattern $\gamma 2$, at $-Vq/2$ in the target voltage pattern $\gamma 3$, at $-Vq$ in the target voltage pattern $\gamma 4$, at $-Vq/2$ in the target voltage pattern $\gamma 5$, and at $Vq/2$ in the target voltage pattern $\gamma 6$. Moreover, the target voltage value of the V-phase output voltage is set at $-Vq/2$ in the target voltage pattern $\gamma 1$, at $Vq/2$ in the target voltage pattern $\gamma 2$, at $Vq$ in the target voltage pattern $\gamma 3$, at $Vq/2$ in the target voltage pattern $\gamma 4$, at −Vq/2 in the target voltage pattern γ5, and at −Vq in the target voltage pattern γ6. Then, the target voltage value of the W-phase output voltage is set at −Vq/2 in the target voltage pattern γ1, at −Vq in the target voltage pattern γ2, at −Vq/2 in the target voltage pattern γ3, at Vq/2 in the target voltage pattern γ4, at Vq in the target voltage pattern γ5, and at Vq/2 in the target voltage pattern γ6.

Figure 10:
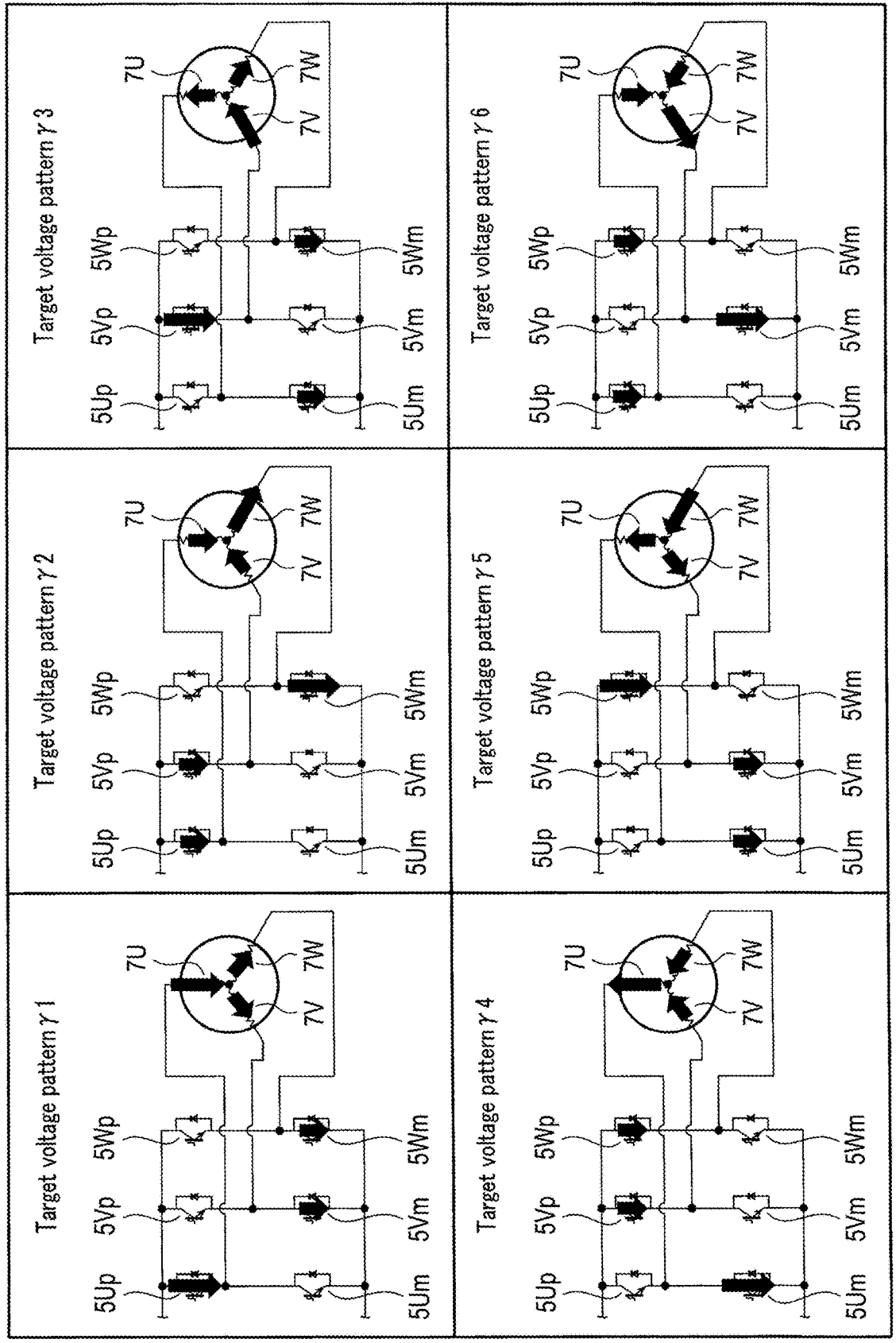
FIG. 10 is a schematic diagram showing a current that flows through the electric power converter and the electric motor in the constant voltage output to the electric motor in each of the six target voltage patterns shown in FIG. 9.

FIG. 10 shows a current that flows through the electric power converter 2 and the electric motor 1 in the constant voltage output to the electric motor 1 in each of the six target voltage patterns γ1 to γ6. In FIG. 10, flows of the currents are shown by arrows. Moreover, with regard to the three windings 7, the U-phase is shown as a winding 7U, the V-phase is shown as a winding 7V, and the W-phase is shown as a winding 7W. Then, with regard to the three positive-side semiconductor elements 5p, the U-phase is shown as a semiconductor element 5Up, the V-phase is shown as a semiconductor element 5Vp, and the W-phase is shown as a semiconductor element 5Wp, and with regard to the three negative-side semiconductor elements 5m, the U-phase is shown as a semiconductor element 5Um, the V-phase is shown as a semiconductor element 5Vm, and the W-phase is shown as a semiconductor element 5Wm.

As shown in FIG. 10 and the like, in the constant voltage output in the target voltage pattern γ1, the current flows from the positive-side electric power source line through the semiconductor element 5Up to the electric motor 1. Then, from the electric motor 1, the current flows to the negative-side electric power source line through either the semiconductor element 5Vm or 5Wm. Moreover, in the constant voltage output in the target voltage pattern γ1, the voltage applied across the semiconductor element 5Up and the winding resistance of the winding 7U becomes constant or substantially constant at the fixed voltage value corresponding to the target voltage value Vq of the U-phase output voltage. Moreover, in the constant voltage output in the target voltage pattern γ2, the current flows from the positive-side electric power source line through either the semiconductor element 5Up or 5Vp to the electric motor 1. Then, from the electric motor 1, the current flows to the negative-side electric power source line through the semiconductor element 5Wm. Moreover, in the constant voltage output in the target voltage pattern γ2, the voltage applied across the winding resistance of the winding 7W and the semiconductor element 5Wm becomes constant or substantially constant at the fixed voltage value corresponding to the target voltage value −Vq of the W-phase output voltage.

In the constant voltage output in the target voltage pattern γ3, the current flows from the positive-side electric power source line through the semiconductor element 5Vp to the electric motor 1. Then, from the electric motor 1, the current flows to the negative-side electric power source line through either the semiconductor element 5Um or 5Wm. Moreover, in the constant voltage output in the target voltage pattern γ3, the voltage applied across the semiconductor element 5Vp and the winding resistance of the winding 7V becomes constant or substantially constant at the fixed voltage value corresponding to the target voltage value Vq of the V-phase output voltage. Moreover, in the constant voltage output in the target voltage pattern γ4, the current flows from the positive-side electric power source line through either the semiconductor element 5Vp or 5Wp to the electric motor 1. Then, from the electric motor 1, the current flows to the negative-side electric power source line through the semiconductor element 5Um. Moreover, in the constant voltage output in the target voltage pattern γ4, the voltage applied across the winding resistance of the winding 7U and the semiconductor element 5Um becomes constant or substantially constant at the fixed voltage value corresponding to the target voltage value −Vq of the U-phase output voltage.

In the constant voltage output in the target voltage pattern γ5, the current flows from the positive-side electric power source line through the semiconductor element 5Wp to the electric motor 1. Then, from the electric motor 1, the current flows to the negative-side electric power source line through either the semiconductor element 5Um or 5Vm. Moreover, in the constant voltage output in the target voltage pattern γ5, the voltage applied across the semiconductor element 5Wp and the winding resistance of the winding 7W becomes constant or substantially constant at the fixed voltage value corresponding to the target voltage value Vq of the W-phase output voltage. Moreover, in the constant voltage output in the target voltage pattern γ6, the current flows from the positive-side electric power source line through either the semiconductor element 5Up or 5Wp to the electric motor 1. Then, from the electric motor 1, the current flows to the negative-side electric power source line through the semiconductor element 5Vm. Moreover, in the constant voltage output in the target voltage pattern γ6, the voltage applied across the winding resistance of the winding 7V and the semiconductor element 5Vm becomes constant or substantially constant at the fixed voltage value corresponding to the target voltage value −Vq of the V-phase output voltage.

In the diagnosis for the electric power converter 2, the current detection circuit 11 detects the current, which flows through the electric motor 1 and the like, in the constant voltage output in each of the above-mentioned target voltage patterns γ1 to γ6. In the constant voltage output in the target voltage pattern γ1, the current that flows through the shunt resistor of the current detection circuit 11 is detected, whereby a current corresponding to the current IUp that flows through the semiconductor element 5Up and the winding 7U is detected. Likewise, the current that flows through the shunt resistor of the current detection circuit 11 is detected, whereby a current corresponding to a current IWm that flows through the semiconductor element 5Wm and the winding 7W is detected in the constant voltage output in the target voltage pattern γ2, a current corresponding to a current IVp that flows through the semiconductor element 5Vp and the winding 7V is detected in the constant voltage output in the target voltage pattern γ3, a current corresponding to a current IUm that flows through the semiconductor element 5Um and the winding 7U is detected in the constant voltage output in the target voltage pattern γ4, a current corresponding to a current IWp that flows through the semiconductor element 5Wp and the winding 7W is detected in the constant voltage output in the target voltage pattern γ5, and a current corresponding to a current IVm that flows through the semiconductor element 5Vm and the winding 7V is detected in the constant voltage output in the target voltage pattern γ6.

Moreover, in the present embodiment, the analog signal that indicates the detection result of the current in the current detection circuit 11 in the above-mentioned constant voltage output is amplified by the amplifier 12, and thereafter, is further amplified by the amplifier 16. Then, the analog signal amplified by the amplifier 16 is input to the A/D converter 21 of the diagnostic apparatus 15. In contrast, in the state in which the electric motor 1 is driven by the three-phase AC electric power from the electric power converter 2, the analog signal that indicates the detection result of the current in the current detection circuit 11 is amplified by the amplifier 12, but is not amplified by the amplifier 16, and is input to the A/D converter (not shown) of the drive control apparatus 8. Hence, the analog signal that indicates the detection result of the current in the constant voltage output is amplified at a higher amplification rate in comparison with the analog signal that indicates the detection result of the current in the state in which the electric motor 1 is driven. Then, the analog signal amplified at a higher amplification rate is transmitted to the diagnostic apparatus 15.

In the diagnostic apparatus 15, the A/D converter 21 converts the analog signal, which indicates the detection result of the current, into the digital signal, and inputs the digital signal to the degradation determination unit 23 and the correction unit 25. Then, the degradation determination unit 23 and the correction unit 25 perform the process based on the detection result of the current, which is indicated by the digital signal. Herein, in the example of FIG. 7 and the like, the number of bits of the A/D converter 21 is the same as the number of bits of the A/D converter of the drive control apparatus 8, and the analog signal transmitted as the detection result of the current in the current detection circuit 11 to the diagnostic apparatus 15 is amplified at a higher amplification rate in comparison with the analog signal transmitted as the detection result of the current in the current detection circuit 11 to the drive control apparatus 8. Therefore, in the constant voltage output, the resolution of the current detected by the current detection circuit 11 is higher in comparison with that in the state in which the electric motor 1 is driven by the AC electric power. That is, the degradation determination unit 23 and the correction unit 25 acquire, at a higher resolution, the detection result of the current that flows through the electric motor 1 in the constant voltage output in comparison with the detection result of the current that flows through the electric motor 1 in the state in which the electric motor 1 is driven.

Figure 11:
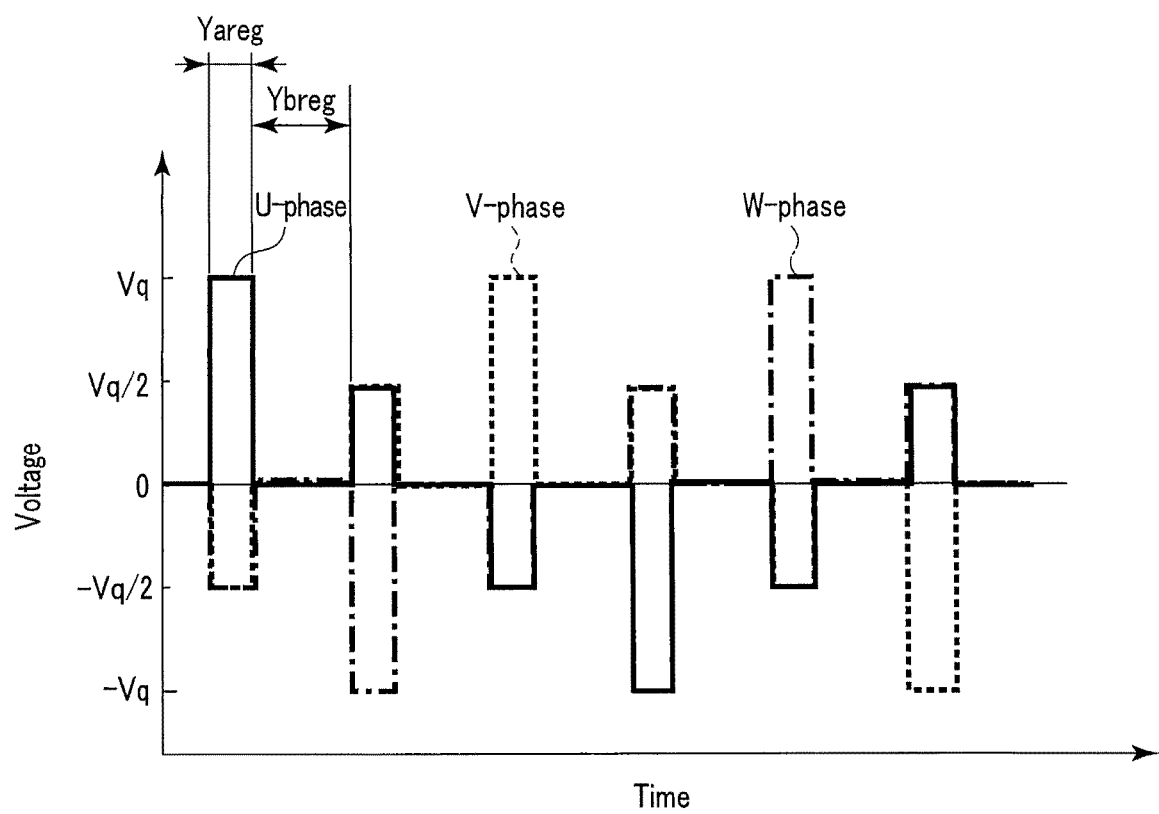
FIG. 11 is a schematic diagram showing an example of changes over time of three-phase output voltages output from the electric power converter to the electric motor in the diagnosis for the electric power converter in the embodiment.

FIG. 11 shows an example of changes over time of the three-phase output voltages output from the electric power converter 2 to the electric motor 1 in the diagnosis for the electric power converter 2. In FIG. 11, a time with a diagnosis starting time taken as a reference is shown on an abscissa axis, and a voltage is shown on an ordinate axis. In the example of FIG. 11, in one diagnosis for the electric power converter 2, the above-mentioned constant voltage outputs are sequentially performed in order of the target voltage patterns $\gamma 1$, $\gamma 2$, $\gamma 3$, $\gamma 4$, $\gamma 5$ and $\gamma 6$. In the diagnosis for the electric power converter 2, a prescribed time Yareg is set as a continuation time while the constant voltage output is continued in each of the target voltage patterns $\gamma 1$ to $\gamma 6$. The prescribed time Yareg is set longer in comparison with a time from the start of the output until when the current that flows through the electric motor 1 reaches the saturation state. However, the prescribed time Yareg is set to a short time to an extent where the rise of the junction temperature of the semiconductor element 5, which is caused by energization, is suppressed. As mentioned above, the current that flows through the electric motor 1 reaches the saturation state by the energization for a time as short as approximately 0.1 s. Therefore, the prescribed time Yareg while the constant voltage output is continued in each of the target voltage patterns $\gamma 1$ to $\gamma 6$ is settable to a short time.

Moreover, in the diagnosis for the electric power converter 2, a prescribed time Ybreg is set as an interval time between the constant voltage outputs of the target voltage patterns $\gamma 1$ to $\gamma 6$. Therefore, in the diagnosis for the electric power converter 2, after the prescribed time Ybreg elapses after a constant voltage output in a certain target voltage pattern is ended, a constant voltage output in a next target voltage pattern is started. Note that, preferably, the prescribed time Ybreg is longer in comparison with the prescribed time Yareg while the constant voltage output is continued. In the constant voltage output in each of the target voltage patterns $\gamma 1$ to $\gamma 6$, the degradation determination unit 23, the correction unit 25 and the like calculate an average value of the current detected by the current detection circuit 11. Therefore, for the constant voltage output in each of the target voltage patterns $\gamma 1$ to $\gamma 6$, the degradation determination unit 23, the correction unit 25 and the like acquire an average value (time-average value) of the currents in the prescribed time Yareg as the detection result of the current that flows through the electric motor 1.

The temperature sensor 17 detects the above-mentioned environmental temperature Ta of the electric power converter 2 (semiconductor element 5), and the temperature sensor 18 detects the above-mentioned temperature T of the electric motor 1. The A/D converter 21 of the diagnostic apparatus 15 converts an analog signal, which indicates detection results of the environmental temperature Ta and the temperature T, into a digital signal, and inputs the digital signal to the correction unit 25. In the storage unit 26, stored is information regarding temperature characteristics of the semiconductor element 5, the information including information indicating a relationship between the above-mentioned saturation voltage of the semiconductor element 5 and the environmental temperature Ta of the electric power converter 2, and the like. Based on the detection result of the environmental temperature Ta of the electric power converter 2 and on the information regarding the temperature characteristics of the semiconductor element 5, the correction unit 25 corrects the detection result of the current that flows through the electric motor 1 in the constant voltage output in each of the target voltage patterns $\gamma 1$ to $\gamma 6$. At this time, the current that flows through the electric motor 1 in the constant voltage output in each of the target voltage patterns $\gamma 1$ to $\gamma 6$ is corrected (converted) from the detection result to the information in the case where the environmental temperature Ta of the electric power converter 2 is the reference temperature Taref.

Moreover, in the storage unit 26, information regarding temperature characteristics of the winding resistance of the electric motor is stored. Based on the detection result of the temperature T of the electric motor and on the information regarding the temperature characteristics of the winding resistance, the correction unit 25 corrects the detection result of the current that flows through the electric motor 1 in the constant voltage output in each of the target voltage patterns $\gamma 1$ to $\gamma 6$. At this time, the current that flows through the electric motor 1 in the constant voltage output in each of the target voltage patterns $\gamma 1$ to $\gamma 6$ is corrected (converted) from the detection result to the information in the case where the temperature T of the electric motor 1 is the reference temperature Tref. As described above, for the current that flows through the electric motor 1 in the constant voltage output, the correction unit 25 corrects the detection result in the current detection circuit 11 to any of the information in the case where the environmental temperature Ta of the electric power converter 2 is the reference temperature Taref, the information in the case where the temperature T of the electric motor 1 is the reference temperature Tref, and the information in the case where the environmental temperature Ta of the electric power converter 2 is the reference temperature Taref and the temperature T of the electric motor 1 is the reference temperature Tref. For the current that flows through the electric motor 1 in the constant voltage output in each of the target voltage patterns $\gamma 1$ to $\gamma 6$, the degradation determination unit 23, the correction unit 25 and the like store, in the storage unit 26, either a detection result including the average value in the prescribed time Yareg, and the like, or the information obtained by correcting the detection result by the correction unit 25 as mentioned above.

Moreover, the diagnosis for the electric power converter 2 is performed regularly on and after the starting time of use of the electric power converter 2. For the current that flows through the electric motor 1 in the constant voltage output in each of the target voltage patterns γ1 to γ6, the degradation determination unit 23 compares information in the diagnosis performed in real time and information in any of diagnoses performed last time and previously with each other. Then, based on a result of the above-mentioned comparison for the current between the information in any of the last and previous diagnoses and the information in the real-time diagnosis, the degradation determination unit 23 determines the degradation state of the corresponding semiconductor element 5.

Note that, in comparison for the current that flows through the electric motor 1 in the constant voltage output in each of the target voltage patterns γ1 to γ6, the detection result in the current detection circuit 11 may be compared, or the information corrected as mentioned above by the correction unit 25 may be compared. However, in the above-mentioned current comparison, preferably, the information in the case where the environmental temperature Ta of the electric power converter 2 is the reference temperature Taref and the temperature T of the electric motor 1 is the reference temperature Tref is compared. Herein, a first period and a second period after the first period are prescribed. Then, it is assumed that any of the last and previous diagnoses is performed in the first period, and that the real-time diagnosis is performed in the second period. In the present embodiment, in each of the first period and the second period, the constant voltage output that constantly sets the output voltage to the electric motor 1 in each of the target voltage patterns γ1 to γ6 is performed.

In the example in FIGS. 7, 9 to 11 and the like, for the current IUp that flows through the semiconductor element 5Up in the constant voltage output in the target voltage pattern γ1, the information in the first period (any of the last and previous diagnoses) and the information in the second period (the real-time diagnosis) are compared with each other. In this case, based on a result of the comparison for the current IUp, the degradation state of the U-phase positive-side semiconductor element 5Up is determined. The degradation determination unit 23 reads out, from the storage unit 26, the information for the current IUp in the first period. Then, regarding the current that flows through the semiconductor element 5Up in the constant voltage output in the target voltage pattern γ1, the degradation determination unit 23 determines whether or not the current shown as the information in the second period decreases by more than a reference level with respect to the current shown as the information in the first period. Then, in the case where the current in the second period decreases by more than the reference level with respect to the current in the first period, the degradation determination unit 23 determines that the degree of degradation of the semiconductor element 5Up exceeds the reference level, and determines that a lifetime of the semiconductor element 5Up is nearly over.

As in the above, also for the current that flows through the corresponding semiconductor element 5 in the constant voltage output in each of the target voltage patterns γ2 to γ6, the information in the first period (any of the last and previous diagnoses) and the information in the second period (the real-time diagnosis) are compared with each other. Thus, for the semiconductor element 5 corresponding to each of the target voltage patterns γ2 to γ6, it is determined whether or not the degree of degradation exceeds the reference level. That is, the information in the first period and the information in the second period are compared with each other for each of the current IWm that flows through the semiconductor element 5Wm in the constant voltage output in the target voltage pattern γ2, the current IVp that flows through the semiconductor element 5Vp in the constant voltage output in the target voltage pattern γ3, the current IUm that flows through the semiconductor element 5Um in the constant voltage output in the target voltage pattern γ4, the current IWp that flows through the semiconductor element 5Wp in the constant voltage output in the target voltage pattern γ5, and the current IVm that flows through the semiconductor element 5Vm in the constant voltage output in the target voltage pattern γ6. Then, as in the semiconductor element 5Up, also for each of the semiconductor elements 5Um, 5Vp, 5Vm, 5Wp and 5Wm, the degree of degradation, the lifetime and the like are determined.

The degradation determination unit 23 allows warning in the case where the degree of degradation of any of the semiconductor elements 5 of the electric power converter 2 exceeds the reference level. The warning is performed using an user interface (not shown) provided in the diagnostic apparatus 15 or separately from the diagnostic apparatus 15, and for example, is performed by any of screen display, sound transmission and the like. Moreover, in the case of performing the warning, the degradation determination unit 23 may allow announcement as to which of the plurality of semiconductor elements 5 has a high degree of degree of degradation. Moreover, in a certain example, in the case where the degree of degradation of any of the semiconductor elements 5 exceeds the reference level, then in place of the warning or in addition to the warning, the degradation determination unit 23 transmits, to the drive control apparatus 8, a command to decrease the output of the AC electric power from the electric power converter 2 to the electric motor 1 at the time when the electric motor 1 is driven. In this case, in a state in which the electric motor 1 is driven, the drive control apparatus 8 controls the operation of the electric power converter 2 based on the command from the diagnostic apparatus 15, thereby decreasing the output of the AC electric power to the electric motor 1 in comparison with the time before the diagnosis is performed.

Moreover, in the present embodiment, the diagnosis for the electric power converter 2 is performed in a state in which the electric motor 1 is not driven for a long time, that is, in a state in which each of the semiconductor element 5 is not energized for a long time. Then, the diagnosis for the electric power converter 2 is performed immediately before the drive of the electric motor 1 is started, and so on. In the example of FIG. 7 and the like, the diagnostic apparatus 15 is communicable with the drive control apparatus 8, and from the drive control apparatus 8, acquires information as to whether or not a drive command to drive the electric motor 1 is input. Then, in the case where the drive command is input, before the electric motor 1 is driven by the control by the drive control apparatus 8, the output control unit 22 allows the constant voltage output of electric power from the electric power converter 2 to the electric motor 1 in each of the target voltage patterns as mentioned above. Thus, before the electric motor 1 is driven by the control by the drive control apparatus 8, the degradation state and the like of each of the semiconductor elements 5 are determined, and the diagnosis for the electric power converter 2 is performed.

Moreover, the determination as to whether or not to determine the diagnosis for the electric power converter 2 may be performed based on, in addition to whether or not the drive command for the electric motor 1 is input, either an elapsed time Xa from the last diagnosis or an elapsed time Xb from the end of the last drive of the electric motor 1. In a certain example, in the case where the elapsed time Xa from the last diagnosis is shorter than a reference time Xaref even if the drive command to drive the electric motor 1 is input, the above-mentioned constant voltage output to the electric motor 1 is not performed, and the diagnosis for the electric power converter 2 is not performed. In another certain example, in the case where the elapsed time Xb from the end of the last drive of the electric motor 1 is shorter than a reference time Xbref even if the drive command to drive the electric motor 1 is input, the above-mentioned constant voltage output to the electric motor 1 is not performed, and the diagnosis for the electric power converter 2 is not performed.

FIG. 12 shows an example of a process performed by the processor and the like of the diagnostic apparatus 15. The process in FIG. 12 is started in a state in which the electric motor 1 is not supplied with AC electric power and the electric motor 1 is not driven. When the process in FIG. 12 is started, then based on the information from the drive control apparatus 8, and the like, the diagnostic apparatus 15 determines whether or not the drive command to drive the electric motor 1 is input (S51). In the case where the drive command is not input (S51—No), the diagnostic apparatus 15 is on standby in S51. Then, when the drive command is input (S51—Yes), then based on the information stored in the storage unit 26, and the like, the diagnostic apparatus 15 determines whether or not the elapsed time Xa from the last diagnosis is equal to or more than the reference time Xaref (S52).

In the case where the elapsed time Xa is equal to or more than the reference time Xaref (S52—Yes), then based on the information from the drive control apparatus 8, and the like, the diagnostic apparatus 15 determines whether or not the elapsed time Xb from the end of the last drive of the electric motor 1 is equal to or more than the reference time Xbref (S53). In the case where the elapsed time Xb is equal to or more than the reference time Xbref (S53—Yes), the diagnostic apparatus 15 performs a diagnostic process for the electric power converter 2 (S54). Then, when the diagnostic process is ended, the diagnostic apparatus 15 transmits, to the drive control apparatus 8, information indicating that the diagnosis is ended, and allows the drive control apparatus 8 to drive the electric motor 1. Then, the drive of the electric motor 1 is controlled as mentioned above by the drive control apparatus 8 (S55). Meanwhile, in each of the case where the elapsed time Xa is shorter than the reference time Xaref (S52—No) and the case where the elapsed time Xb is shorter than the reference time Xbref (S53—No), the electric motor 1 is driven without performing the diagnostic process, and the drive of the electric motor 1 is controlled by the drive control apparatus 8 (S55).

Figure 13:
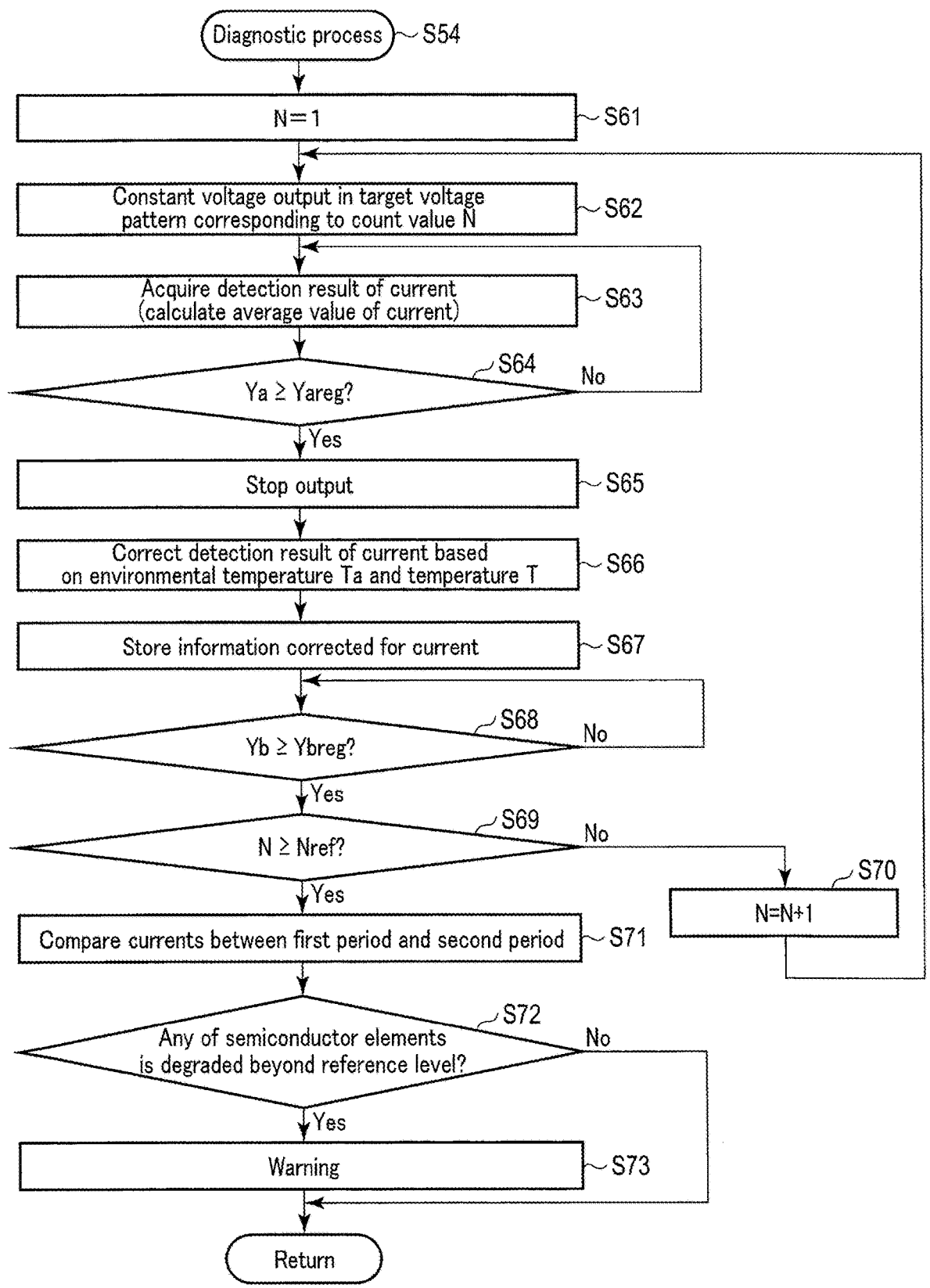
FIG. 13 is a flowchart schematically showing an example of a diagnostic process for the electric power converter, which is shown in FIG. 12.

FIG. 13 shows an example of the diagnostic process (S54) for the electric power converter 2. In the process of FIG. 13, a count value N is prescribed, and the count value N is settable to a natural number of equal to or more than 1 and equal to or less than a reference value Nref. In a certain example, in the diagnostic process, the constant voltage output is performed in each of the above-mentioned six target voltage patterns γ1 to γ6, and the reference value Nref is 6. Then, the count value N is settable to a natural number of equal to or more than 1 and equal to or less than 6. When the diagnostic process of FIG. 13 is started, the output control unit 22 sets the count value N to 1 (S61). Then, the output control unit 22 allows the constant voltage output from the electric power converter 2 to the electric motor 1 in a target voltage pattern corresponding to the count value N set in the plurality of target voltage patterns (S62). In a certain example, in the case where the count value N is set to 1, the constant voltage output is performed in the above-mentioned target voltage pattern γ1. Then, the degradation determination unit 23 or the like acquires a detection result of a current that flows through the electric motor 1 in the constant voltage output in the target voltage pattern corresponding to the count value N (S63). At this time, the degradation determination unit 23 calculates an average value (time-average value) for the current that flows through the electric motor 1.

Then, the output control unit 22 determines whether or not a continuation time Ya of the constant voltage output is equal to or more than the prescribed time Yareg (S64). In the case where the continuation time Ya is shorter than the prescribed time Yareg (S64—No), the process returns to S63, and processes in S63 and after are sequentially performed. Therefore, the constant voltage output in the target voltage pattern corresponding to the count value N is continued. Meanwhile, in the case where the continuation time Ya is equal to or more than the prescribed time Yareg (S64—Yes), the output control unit 22 allows a stop of the output from the electric power converter 2 to the electric motor 1 (S65), and allows an end of the constant voltage output. Note that the average value for the current that flows through the electric motor 1 is calculated while the constant voltage output is being performed, whereby the degradation determination unit 23 and the like acquire the average value of the currents in the prescribed time Yareg as the detection result of the current that flows through the electric motor 1 for the constant voltage output in the target voltage pattern corresponding to the count value N.

Then, the correction unit 25 corrects the detection result for the current that flows through the electric motor 1 in the constant voltage output in the target voltage pattern corresponding to the count value N based on the detection result of the environmental temperature Ta of the electric power converter 2 and the detection result of the temperature T of the electric motor 1 (S66). The correction of the detection result of the current, which is based on the environmental temperature Ta and the temperature T, is performed as mentioned above. Then, the correction unit 25 and the like store, in the storage unit 26, the information obtained by correcting the detection result for the current that flows through the electric motor 1 in the constant voltage output in the target voltage pattern corresponding to the count value N (S67). Then, the output control unit 22 determines whether or not an elapsed time Yb from the end of the last constant voltage output is equal to or more than the prescribed time Ybreg (S68). In the case where the elapsed time Yb is shorter than the prescribed time Ybreg (S68—No), the diagnostic apparatus 15 is on standby in S68. Meanwhile, in the case where the elapsed time Yb is equal to or more than the prescribed time Ybreg (S68—Yes), the output control unit 22 and the like determine whether or not the count value N is equal to or more than the reference value Nref (S69).

In the case where the count value N is smaller than the reference value Nref (S69—No), the output control unit 22 and the like add only one to the count value N (S70), and updates the count value N. Then, the process returns to S62, and processes in S62 and after are sequentially performed. Therefore, the constant voltage output is performed from the electric power converter 2 to the electric motor 1 in a target voltage pattern corresponding to the updated count value N. In the case where the count value N is equal to or more than the reference value Nref in S69 (S69—Yes), then for the current that flows through the electric motor 1 in the constant voltage output in each of the plurality (the same number as that of the reference values Nref) of target voltage patterns, the degradation determination unit 23 compares the information in the second period (the diagnosis performed in real time) and the information in the first period (any of the diagnoses performed last time and previously) with each other (S71). In the example in FIG. 13, for the current that flows through the electric motor 1 in the constant voltage output in each of the target voltage patterns, the information in the case where the environmental temperature Ta of the electric power converter 2 is the reference temperature Taref and the temperature T of the electric motor 1 is the reference temperature Tref is subjected to the comparison. The comparison of the current between the first period and the second period is performed as mentioned above.

Then, based on a result of the comparison in S71, the degradation determination unit 23 determines whether or not any of the semiconductor elements 5 of the electric power converter 2 is degraded beyond the reference level (S72). The determination of the degradation state of each of the semiconductor elements 5, which is based on such a comparison result of the current between the first period and the second period, is performed as mentioned above. The degradation determination unit 23 and the like allow warning (S73) in the case where the degree of degradation exceeds the reference level in any of the semiconductor elements 5 (S72—Yes). Meanwhile, in the case where the degree of degradation does not exceed the reference level in any of the semiconductor elements 5 (S72—No), the degradation determination unit 23 and the like end the diagnostic process without allowing the warning and the like.

As mentioned above, in the present embodiment, in the diagnosis for the electric power converter 2, the output control unit 22 of the diagnostic apparatus 15 controls the operation of the semiconductor element 5, thereby allowing the output of electric power from the electric power converter 2 to the electric motor 1 in the constant voltage output that constantly sets the output voltage to the electric motor 1 in the target voltage pattern. Then, the degradation determination unit 23 determines the degradation state for at least one of the semiconductor elements 5 based on the current that flows through the electric motor 1 at the above-mentioned constant voltage output. Therefore, the degradation state of each of the semiconductor elements 5 provided in the electric power converter 2 is determined without generating a short-circuit current in the electric power converter 2. Moreover, as mentioned above, the current that flows through the electric motor 1 in the constant voltage output changes according to the change of the saturation voltage of the corresponding semiconductor element 5. Therefore, the change of the current that flows through the electric motor 1 in the constant voltage output is detected, whereby the change (rise) of the saturation voltage of the corresponding semiconductor element 5 is appropriately detected, and the degradation state of the corresponding semiconductor element 5 is appropriately determined.

Moreover, in the present embodiment, the constant voltage outputs, each of which constantly sets the output voltage to the electric motor 1 in the target voltage pattern, are sequentially performed in the plurality of target voltage patterns (for example, γ1 to γ6) different from one another in terms of the application state of the output voltage in the electric motor 1 from the electric power converter 2. Then, based on the current that flows through the electric motor 1 in the constant voltage output in each of the plurality of target voltage patterns, the degradation state of the corresponding semiconductor element 5 is determined. Such constant voltage outputs are performed from the electric power converter 2 in the plurality of target voltage patterns different from one another in terms of the application state of the voltage in the electric motor 1, thus making it possible to appropriately determine the degradation state and the like for the plurality of semiconductor elements 5 mounted on the electric power converter 2. For example, based on the current that flows through the electric motor 1 in the constant voltage output in the target voltage pattern γ1, the degradation state of the semiconductor element 5Up is appropriately determined as mentioned above, and based on the current that flows through the electric motor 1 in the constant voltage output in the target voltage pattern γ2, the degradation state of the semiconductor element 5Wm is appropriately determined as mentioned above.

Moreover, in the example in FIGS. 7, 9 to 11 and the like, in the diagnosis for the electric power converter 2, the number of patterns of the target voltage patterns, in each of which the constant voltage output is performed, is equal to or more than the number of the semiconductor elements 5 of the electric power converter 2. Therefore, for all of the semiconductor elements 5 mounted on the electric power converter 2, it becomes possible to appropriately determine the degradation state and the like. Thus, it becomes possible to appropriately determine such a semiconductor element 5, which has a higher degree of degradation, among the semiconductor elements 5 mounted on the electric power converter 2. Hence, accuracy in the diagnosis for the electric power converter 2 increases.

Moreover, in the present embodiment, based on the detection result of the temperature T of the electric motor 1 and on the temperature characteristics of the winding resistance of the electric motor 1, the correction unit 25 corrects the detection result of the current that flows through the electric motor 1 in the constant voltage output. Then, based on the information obtained by correcting the above-mentioned detection result of the current according to the temperature T and the like of the electric motor 1, the degradation determination unit 23 determines the degradation state of the semiconductor element 5. Therefore, the degradation state of the semiconductor element 5 is determined in appropriate consideration of an influence of the winding resistance of the electric motor 1 to the current that flows through the electric motor 1 in the constant voltage output, that is, an influence of the winding resistance of the electric motor 1 to the saturation voltage of the corresponding semiconductor element 5.

Moreover, in the present embodiment, based on the detection result of the environmental temperature Ta of the electric power converter 2 (semiconductor element 5) and on the temperature characteristics of the semiconductor element 5, the correction unit 25 corrects the detection result of the current that flows through the electric motor 1 in the constant voltage output. Then, based on the information obtained by correcting the above-mentioned detection result of the current according to the environmental temperature Ta and the like of the electric power converter 2, the degradation determination unit 23 determines the degradation state of the semiconductor element 5. Therefore, the degradation state of the semiconductor element 5 is determined in appropriate consideration of an influence of the temperature of the semiconductor element 5 to the current that flows through the electric motor 1 in the constant voltage output, that is, the temperature characteristics of the saturation voltage of the semiconductor element 5.

Moreover, in the present embodiment, the diagnostic process for the electric power converter 2 is performed immediately before the drive of the electric motor 1 is started by AC electric power. Moreover, the diagnosis for the electric power converter 2 is performed only in the case where the elapsed time Xb from the end of the last drive of the electric motor 1 becomes equal to or more than the reference time Xbref. Thus, the diagnosis for the electric power converter 2 is appropriately performed in a state in which each of the semiconductor elements 5 is not energized for a long time. Moreover, in the above-mentioned embodiment, the continuation time while the constant voltage output is continued at the time of diagnosis is short, and the time while each of the semiconductor elements 5 is energized in the constant voltage output is a short time. Therefore, the rise of the junction temperature of the semiconductor element 5, which is caused by the energization in the constant voltage output, is appropriately suppressed. Thus, even if it is regarded that the environmental temperature of the semiconductor element 5 (electric power converter 2) coincide with the junction temperature of each of the semiconductor elements 5, it becomes possible to appropriately determine the degradation state and the like of the semiconductor element 5 as mentioned above.

Moreover, in the determination of the degradation state of each of the semiconductor elements 5, such a determination is performed while regarding the environmental temperature coincides with the junction temperature, and therefore, it is not necessary to provide, in the electric power converter 2, a sensor or the like which detects the junction temperature of each of the semiconductor elements 5. Thus, the configuration and the like of the electric power converter 2 are appropriately suppressed from being complicated. Further, in the present embodiment, every time when the diagnosis for the electric power converter 2 is performed, the information regarding the current that flows through the electric motor 1 in the constant voltage output in each of the target voltage patterns is stored as a diagnostic result in the storage unit 26. Therefore, for the current that flows through the electric motor 1 in the constant voltage output, it becomes possible to compare the information in any of the last and previous diagnoses (first period) and the information in the real-time diagnosis (second period) with each other. Thus, it becomes possible to more appropriately determine the degradation state and the like of the semiconductor element 5.

Moreover, in the present embodiment, the diagnostic apparatus 15 acquires, at a higher resolution, the detection result of the current that flows through the electric motor 1 in the above-mentioned constant voltage output in comparison with the detection result of the current that flows through the electric motor 1 in the state in which the electric motor 1 is driven. Herein, with regard to the current that flows through the electric motor 1 in the constant voltage output, the variation thereof between the state in which the corresponding semiconductor element 5 is not degraded and the state in which the degree of degradation of the corresponding semiconductor element 5 is high is small as mentioned above. In the present embodiment, the detection result of the current that flows in the constant voltage output is acquired at a high resolution, and therefore, it becomes possible to appropriately detect the above-mentioned small change of the current caused by the degradation of the corresponding semiconductor element 5. Thus, the degradation state of the semiconductor element 5 is more appropriately determined.

Note that, in the example in FIG. 7, the diagnostic apparatus 15 and the drive control apparatus 8 are provided separately from each other, but are not limited to this. In a certain example, the diagnostic apparatus 15 may perform the process, which is performed by the drive control apparatus 8 in the above-mentioned embodiment and the like, as well as performs the diagnosis for the electric power converter 2 similarly to the above-mentioned embodiment and the like. In this case, in the state in which the electric motor 1 is driven by the supply of AC electric power, the diagnostic apparatus 15 controls the operations of the semiconductor elements 5 of the electric power converter 2, thereby controlling the output of the plural-phase AC electric power from the electric power converter 2 to the electric motor 1.

Moreover, in a certain example, provided is a voltage detection circuit that detects an output voltage output from the DC electric power source 3 to the electric power converter 2. In this case, the output control unit 22 of the diagnostic apparatus 15 acquires a detection result of the output voltage from the DC electric power source 3. Then, the output control unit 22 controls the operations of the plurality of semiconductor elements 5 of the electric power converter 2 based on the output voltage from the DC electric power source 3, thereby allowing the output of electric power from the electric power converter 2 to the electric motor 1 in the constant voltage output that constantly sets the output voltage to the electric motor 1 in the target voltage pattern as mentioned above. Therefore, even if the output voltage from the DC electric power source 3 changes, the output from the electric power converter 2 is controlled according to the change of the output voltage from the DC electric power source 3, whereby electric power is output from the electric power converter 2 to the electric motor 1 in the constant voltage output that constantly sets the output voltage to the electric motor 1 in the target voltage pattern.

(Verification that Relates to Embodiment)

Moreover, a first verification that follows was performed as a verification that relates to the above-mentioned embodiment and the like. In the first verification, performed was a power cycle test in which an electric power converter similar to the electric power converter 2 was operated by a power cycle under a predetermined condition. Then, in the power cycle test, diagnosis for the electric power converter was periodically performed. In the present verification, the diagnosis was performed for the electric power converter in a plurality of states including a state in which the power cycle was performed 30 times (30 cycles) and a state in which the power cycle was performed 15360 times. In each of the diagnoses performed a plurality of times, as in the example in FIGS. 7 and 9 to 11 in the above-mentioned embodiment, the constant voltage outputs, each of which constantly set the output voltage to the electric motor in the target voltage pattern, were sequentially performed in order of the target voltage patterns $\gamma1$, $\gamma2$, $\gamma3$, $\gamma4$, $\gamma5$ and $\gamma6$. The constant voltage output in each of the target voltage patterns $\gamma1$ to $\gamma6$ was continued for a continuation time to an extent where the rise of the junction temperature of the semiconductor element was suppressed, and an interval time was provided between a constant voltage output in a certain target voltage pattern and a constant voltage output in a next target voltage pattern. In each of the diagnoses performed in the power cycle test, the U-phase current that flew through the electric motor in the constant voltage output in each of the target voltage patterns $\gamma1$ to $\gamma6$ was detected.

FIG. 14 shows a change over time of the U-phase current that flows through the electric motor in a state in which such constant voltage outputs are sequentially performed in the six target voltage pattern γ1 to γ6 at two diagnostic times different from each other. In FIG. 14, a time with a diagnosis starting time taken as a reference is shown on an abscissa axis, and the U-phase current is shown on an ordinate axis. Moreover, in FIG. 14, the current IUp that flows from the positive-side semiconductor element (5Up for example) toward the electric motor is shown by a positive value, and the current IUm that flows from the electric motor toward the negative-side semiconductor element (5Um for example) is shown by a negative value. Then, in FIG. 14, for each of the state (solid line) in which the power cycle was performed 30 times immediately after the power cycle test was started and the state (broken line) in which the power cycle was performed 15360 times, the change over time of the U-phase current in the diagnosis is shown. As shown in FIG. 14, in the present verification, the U-phase current IUp that flows through the electric motor in the constant voltage output in the target voltage pattern γ1 decreased in the state in which the power cycle was performed 15360 times by 170 mA with respect to the state in which the power cycle was performed 30 times. Note that, in the power cycle test in the present verification, a failure occurred in the U-phase positive-side semiconductor element (5Up for example) immediately after the power cycle was performed 15360 times.

FIG. 15 shows, as a verification result in the present verification, a relationship between the number of power cycle times and the U-phase current IUp that flows through the electric motor in the constant voltage output in the corresponding target voltage pattern γ1. In FIG. 15, the number of power cycle times (the number of cycles) is shown on an abscissa axis, and the U-phase current IUp that flows from the positive-side semiconductor element to the electric motor is shown on an ordinate axis. As shown in FIG. 15 and the like, in the present verification, it was proven that, as the number of power cycle times increases, the U-phase current IUp that flows through the electric motor in the constant voltage output in the target voltage pattern γ1 decreases.

Moreover, in the present verification, the temperature T of the electric motor was detected. Then, in each of the diagnoses for the electric power converter, which was performed a plurality of times, the detection result of the U-phase current IUp that flows through the electric motor in the constant voltage output in the target voltage pattern γ1 was corrected based on the detected temperature T of the electric motor and the temperature characteristics of the winding resistance of the electric motor as in the above-mentioned embodiment and the like. In the present verification, the detection result of the U-phase current IUp was corrected while setting, to 20° C., the reference temperature Tref for the temperature T of the electric motor, and with regard to the U-phase current IUp that flows through the electric motor in the constant voltage output in the target voltage pattern γ1, information thereof in the case where the temperature T was 20° C. was calculated as a correction value (correction information).

Figure 16:
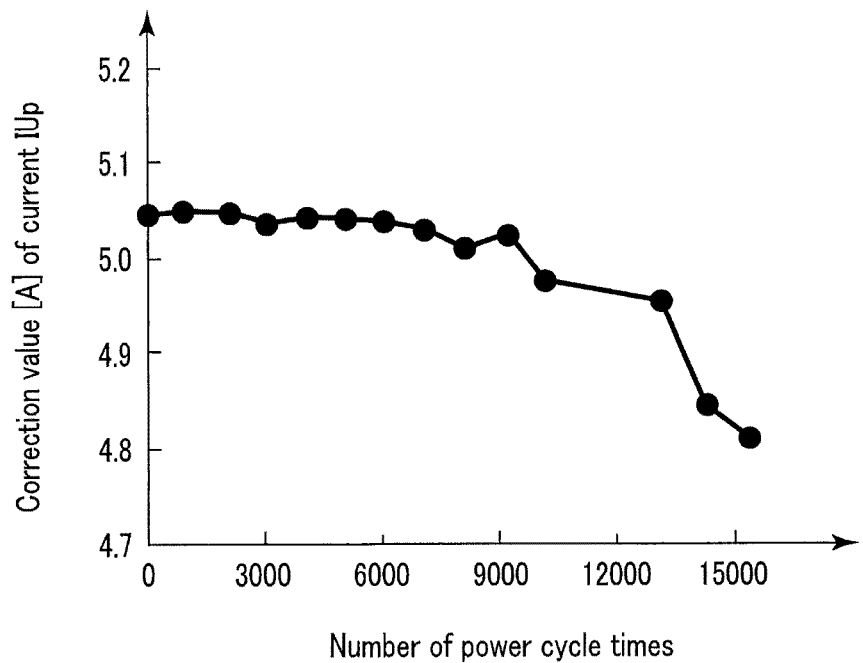
FIG. 16 is a schematic diagram showing a result of correcting, from the relationship shown in FIG. 15, the detected U-phase current to a correction value in the case where temperature of the electric motor is 20° C.

FIG. 16 shows a result of correcting, from the relationship shown in FIG. 15, the detected U-phase current IUp to the correction value in the case where the temperature T of the electric motor is 20° C. In FIG. 16, the number of power cycle times (the number of cycles) is shown on an abscissa axis, and the correction value for the U-phase current IUp in the case where the temperature T is 20° C. is shown on an ordinate axis. As shown in FIG. 16, with regard to the U-phase current IUp that flows through the electric motor in the constant voltage output in the target voltage pattern γ1, the detection result is corrected to the correction value in the case where the temperature T of the electric motor is 20° C., whereby the decrease of the current IUp in the constant voltage output in the target voltage pattern γ1, the decrease following the increase of the number of power cycle times, was more clearly shown.

Moreover, in the present verification, in each of the diagnoses performed in the power cycle test, the above-mentioned analog signal that shows the change over time of the U-phase current in the state in which the constant voltage outputs are sequentially performed in the target voltage patterns γ1 to γ6 was amplified using the amplifier. Then, the amplified analog signal was converted into a digital signal by the A/D converter, and the digital signal that shows the change over time of the U-phase current was converted into a voltage signal as an analog signal by the D/A converter.

Figure 17:
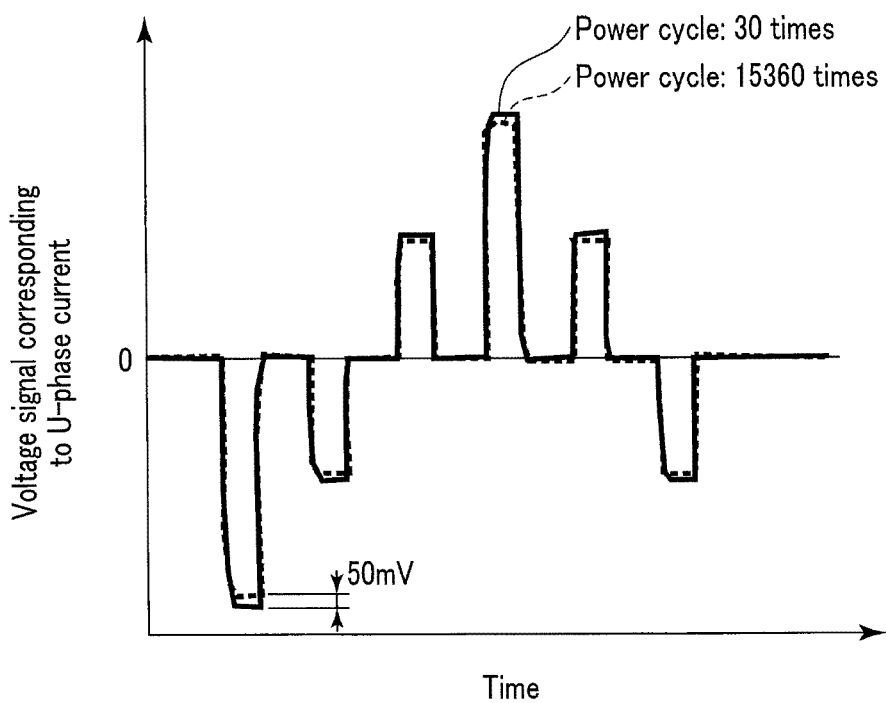
FIG. 17 is a schematic diagram showing a voltage signal generated by performing amplification and A/D conversion and thereafter D/A conversion for each of changes over time of the U-phase current shown in FIG. 14.

FIG. 17 shows a voltage signal generated by performing amplification and A/D conversion and thereafter D/A conversion for each of the changes over time of the U-phase current shown in FIG. 14. In FIG. 17, a time with a diagnosis starting time taken as a reference is shown on an abscissa axis, and the voltage signal corresponding to the U-phase current is shown on an ordinate axis. Note that, in the present verification, the analog signal was inverted and amplified in the amplification of the U-phase current. Therefore, in the voltage signal shown in FIG. 17, polarity thereof was inverted with respect to the U-phase current shown in FIG. 14. That is, in FIG. 17, the voltage corresponding to the current IUp that flows from the positive-side semiconductor element (5Up for example) toward the electric motor is shown by a negative value, and the voltage corresponding to the current IUm that flows from the electric motor toward the negative-side semiconductor element (5Um for example) is shown by a positive value.

As shown in FIG. 17, in the present verification, a magnitude of the voltage corresponding to the U-phase current IUp that flows through the electric motor in the constant voltage output in the target voltage pattern γ1 decreased in the state in which the power cycle was performed 15360 times by 50 mV with respect to the state in which the power cycle was performed 30 times. Such a change of 50 mV in the voltage signal corresponds to a change of 130 mA in the U-phase current. In the present verification, the decrease of the current IUp in the constant voltage output in the target voltage pattern γ1, the decrease following the increase of the number of power cycle times, was appropriately detected. Therefore, it was proven that the degradation state of the U-phase positive-side semiconductor element (5Up for example) is appropriately determined based on the decrease of the current IUp in the constant voltage output in the target voltage pattern γ1.

Moreover, the following second verification was performed as another verification than the first verification. In the second verification, performed was a cycle test in which an electric power converter similar to the electric power converter 2 was operated by a power cycle under a predetermined condition different from that of the first verification. Then, in the power cycle test, diagnosis for the electric power converter was periodically performed. In each of the diagnoses performed a plurality of times, as in the example in FIGS. 7 and 9 to 11 in the above-mentioned embodiment, the constant voltage outputs, each of which constantly set the output voltage to the electric motor in the target voltage pattern, were sequentially performed in the target voltage patterns γ1 to γ6. A continuation time of the constant voltage output in each of the target voltage patterns γ1 to γ6 and an interval time between a constant voltage output in a certain target voltage pattern and a constant voltage output in a next target voltage pattern were set as in the first verification.

Moreover, in each of the diagnoses performed in the present verification, the current that flows through the electric motor in the constant voltage output was detected as in the above-mentioned embodiment. At this time, individually detected were: the U-phase current IUp that flows through the electric motor from the positive-side semiconductor element (5Up for example) in the constant voltage output in the target voltage pattern γ1; the W-phase current IWm that flows through the electric motor to the negative-side semiconductor element (5Wm for example) in the constant voltage output in the target voltage pattern γ2; the V-phase current IVp that flows through the electric motor from the positive-side semiconductor element (5Vp for example) in the constant voltage output in the target voltage pattern γ3; the U-phase current IUm that flows through the electric motor to the negative-side semiconductor element (5Um for example) in the constant voltage output in the target voltage pattern γ4; the W-phase current IWp that flows through the electric motor from the positive-side semiconductor element (5Wp for example) in the constant voltage output in the target voltage pattern γ5; and the V-phase current IVm that flows through the electric motor to the negative-side semiconductor element (5Vm for example) in the constant voltage output in the target voltage pattern γ6.

Moreover, also in the present verification, the temperature T of the electric motor was detected. Then, in each of the diagnoses for the electric power converter, which was performed a plurality of times, the detection result of each of the currents IUp, IUm, IVp, IVm, IWp and IWm was corrected based on the detected temperature T of the electric motor and the temperature characteristics of the winding resistance of the electric motor as in the above-mentioned embodiment and the like. In the present verification, the detection result of each of the currents IUp, IUm, IVp, IVm, IWp and IWm was corrected while setting, to 20° C., the reference temperature Tref for the temperature T of the electric motor, and with regard to the current that flows through the electric motor in the constant voltage output in each of the target voltage patterns γ1 to γ6, information thereof in the case where the temperature T was 20° C. was calculated as a correction value (correction information).

Figure 18:
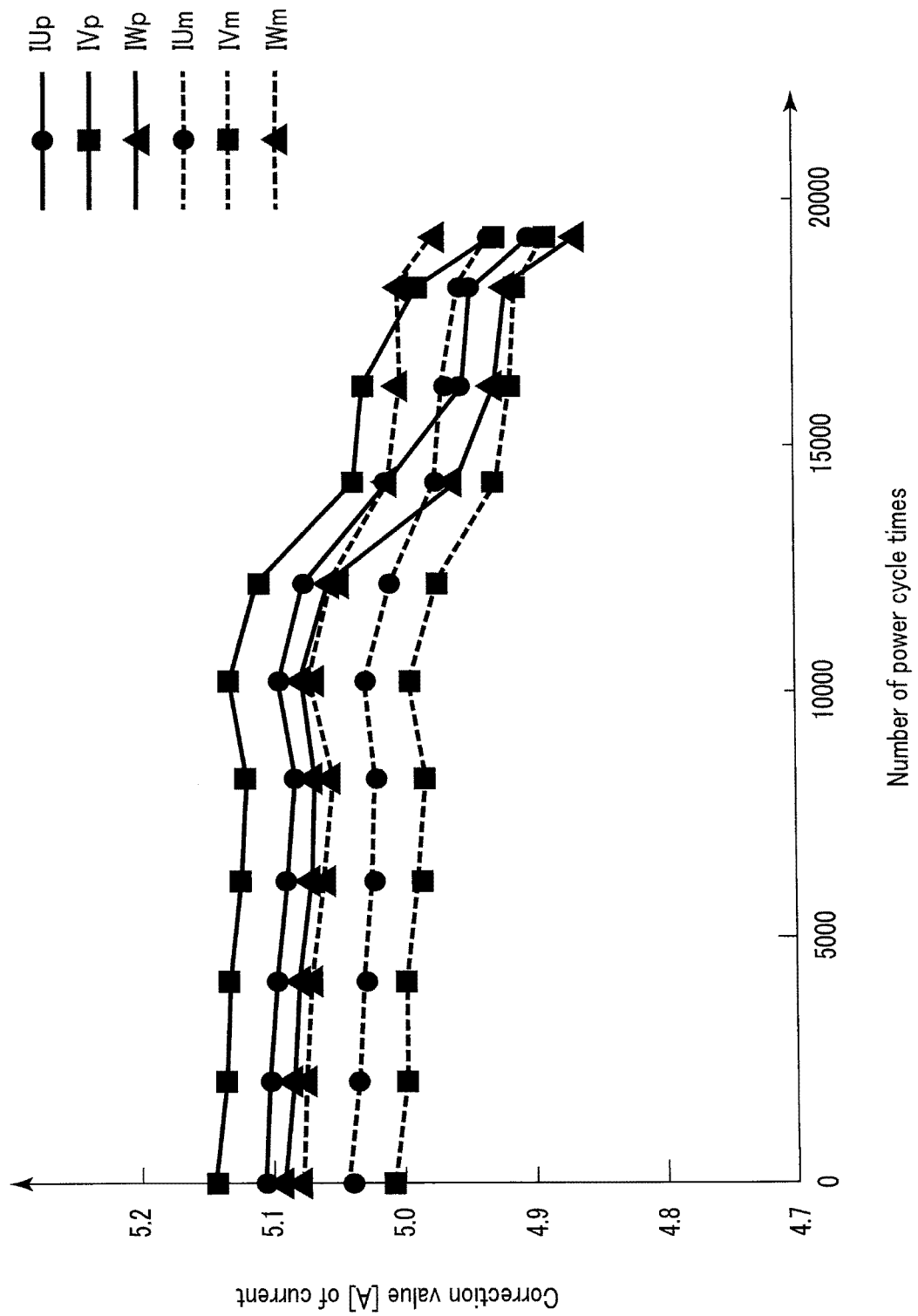
FIG. 18 is a schematic diagram showing, as a verification result in a second verification, a relationship of a correction value of the current detected in the constant voltage output of each of the six target voltage patterns with respect to the number of power cycle times.

FIG. 18 shows, as a verification result in the present verification, a relationship of a correction value of the current detected in the constant voltage output of each of the six target voltage patterns γ1 to γ6 with respect to the number of power cycle times. That is, FIG. 18 shows a relationship, with respect to the number of power cycles, of the correction value of each of the detected currents IUp, IUm, IVp, IVm, IWp and IWm in the case where the temperature T is 20° C. In FIG. 18, the number of power cycle times (the number of cycles) is shown on an abscissa axis, and the correction values for the current in the case where the temperature T is 20° C. are shown on an ordinate axis. As shown in FIG. 18 and the like, in the present verification, it was proven that, as the number of power cycle times increases, the current that flows through the electric motor in the constant voltage output in each of the target voltage patterns γ1 to γ6 decreases. That is, it was proven that, as the number of power cycle times increases, each of the currents IUp, IUm, IVp, IVm, IWp and IWm decreases.

Moreover, as shown in FIG. 18, immediately after the power cycle test was started, with regard to the correction value of each of the currents IUp, IUm, IVp, IVm, IWp and IWm, an amount of decrease thereof that follows the increase of the number of power cycle times is small.

Meanwhile, in a state in which the power cycle was performed some finite number of times, with regard to the correction value of each of the currents IUp, IUm, IVp, IVm, IWp and IWm, the amount of decrease that follows the increase of the number of power cycle times is large. Therefore, it was proven that, with regard to each of the currents IUp, IUm, IVp, IVm, IWp and IWm, the information in the real-time diagnosis and the information in the last and previous diagnoses are compared with each other in terms of variation, whereby it becomes possible to appropriately determine the degradation state of the corresponding semiconductor element.

Moreover, in the present verification, immediately after a final diagnosis for the electric power converter was performed, a failure occurred on the V-phase positive-side semiconductor element (5Vp for example). Herein, the degradation of the V-phase positive-side semiconductor element largely affects the current that flows through the electric motor in the constant voltage output in the target voltage pattern γ3, that is, the current IVp. As shown in FIG. 18 and the like, in the present verification, with regard to the current IVp, a correction value in the final diagnosis decreased by approximately 4% with respect to a correction value in an initial diagnosis at the starting time of the power cycle test. Hence, with regard to the current that flows through the electric motor in the constant voltage output, it was proven that, by comparison between information in the initial diagnosis and information in the real-time diagnosis, it becomes possible to appropriately determine the degradation state of the corresponding semiconductor element.

According to at least one embodiment or example among these, the operations of the plurality of semiconductor elements of the electric power converter are controlled, whereby electric power is output from the electric power converter to the electric motor by the constant voltage output that constantly sets the output voltage to the electric motor in the target voltage pattern. Then, the degradation state is determined for at least one of the semiconductor elements based on the current that flows through the electric motor in the constant voltage output from the electric power converter to the electric motor. Thus, there can be provided the diagnostic apparatus, the diagnostic system, the diagnostic method and the diagnostic program for the electric power converter, which appropriately determine the degradation state of the semiconductor element without generating a short-circuit current in the electric power converter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A diagnostic apparatus that performs diagnosis for an electric power converter that drives an electric motor by outputting converted AC electric power to the electric motor, the diagnostic apparatus comprising:
an output control unit configured to control operations of a plurality of semiconductor elements of the electric power converter to output electric power from the electric power converter to the electric motor at a constant voltage output that constantly sets an output voltage to the electric motor in a target voltage pattern; and a degradation determination unit configured to determine a degradation state for at least one of the semiconductor elements based on a current that flows through the electric motor at the constant voltage output from the electric power converter to the electric motor, wherein the degradation determination unit is further configured to cause output of a degradation warning in response to determining that the degradation state satisfies a threshold.

2. The diagnostic apparatus according to claim 1, wherein the output control unit allows sequential execution of the constant voltage outputs, each of which constantly sets the output voltage to the electric motor in the target voltage pattern, in a plurality of target voltage patterns different from one another in terms of an application state of the output voltage from the electric power converter in the electric motor, and the degradation determination unit determines the degradation state for at least one of the semiconductor elements based on the current that flows through the electric motor at the constant voltage output in each of the target voltage patterns.

3. The diagnostic apparatus according to claim 2, wherein the output control unit allows sequential execution of the constant voltage outputs, each of which constantly sets the output voltage to the electric motor in the target voltage pattern, in target voltage patterns different from one another in terms of the application state of the output voltage from the electric power converter in the electric motor, a number of the target voltage patterns being equal to or more than a number of the semiconductor elements of the electric power converter.

4. The diagnostic apparatus according to claim 1, wherein the output control unit allows execution of the constant voltage output that constantly sets the output voltage to the electric motor in the target voltage pattern in each of a first period and a second period after the first period, and the degradation determination unit determines the degradation state for at least one of the semiconductor elements by comparing, with each other, the current that flows through the electric motor at the constant voltage output in the first period and the current that flows through the electric motor at the constant voltage output in the second period.

5. The diagnostic apparatus according to claim 1, further comprising a correction unit configured to perform at least one of correction of a detection result for the current that flows through the electric motor at the constant voltage output based on a detection result for a temperature of the electric motor and information regarding temperature characteristics of a winding resistance of the electric motor or correction of a detection result for the current that flows through the electric motor at the constant voltage output based on a detection result for an environmental temperature of the electric power converter and information regarding temperature characteristics of the semiconductor element, wherein the degradation determination unit determines the degradation state for at least one of the semiconductor elements based on information obtained by correcting the detection result regarding the current that flows through the electric motor at the constant voltage output.

6. The diagnostic apparatus according to claim 1, wherein the degradation determination unit acquires, at a higher resolution, a detection result for the current that flows through the electric motor at the constant voltage output in comparison with a detection result for a current that flows through the electric motor in a state in which the electric motor is driven by the AC electric power from the electric power converter.

7. The diagnostic apparatus according to claim 1, wherein the output control unit allows execution of the constant voltage output that constantly sets the output voltage to the electric motor in the target voltage pattern before the electric motor is started to be driven by the AC electric power from the electric power converter, and the degradation determination unit determines the degradation state for at least one of the semiconductor elements based on the current that flows through the electric motor at the constant voltage output before the electric motor is started to be driven by the AC electric power from the electric power converter.

8. A diagnostic system of an electric power converter comprising:

the diagnostic apparatus according to claim 1;

the electric power converter including the semiconductor elements, the operation of each of the semiconductor elements being controlled by the output control unit of the diagnostic apparatus; and the electric motor driven by output, from the electric power converter, the AC electric power converted by the electric power converter, wherein the electric power converter outputs the electric power to the electric motor at the constant voltage output that constantly sets the output voltage to the electric motor in the target voltage pattern in accordance with a control for the operation of each of the semiconductor elements by the output control unit.

9. The diagnostic apparatus according to claim 1, wherein the degradation determination unit is further configured to determine the degradation state utilizing at least an output of a temperature sensor.

10. A diagnostic method for performing diagnosis for an electric power converter that drives an electric motor by outputting converted AC electric power to the electric motor, the diagnostic method comprising:

controlling operations of a plurality of semiconductor elements of the electric power converter to output electric power from the electric power converter to the electric motor at a constant voltage output that constantly sets an output voltage to the electric motor in a target voltage pattern;

determining a degradation state for at least one of the semiconductor elements utilizing at least an output of a temperature sensor based on a current that flows through the electric motor at the constant voltage output from the electric power converter to the electric motor; and outputting a degradation warning in response to determining that the degradation state satisfies a threshold.

11. A non-transitory storage medium storing a diagnostic program for performing diagnosis for an electric power converter that drives an electric motor by outputting converted AC electric power to the electric motor, the diagnostic program causing a computer to:

control operations of a plurality of semiconductor elements of the electric power converter to output electric power from the electric power converter to the electric motor at a constant voltage output that constantly sets an output voltage to the electric motor in a target voltage pattern;

determine a degradation state for at least one of the semiconductor elements utilizing at least an output of a temperature sensor based on a current that flows through the electric motor at the constant voltage output from the electric power converter to the electric motor; and output a degradation warning in response to determining that the degradation state satisfies a threshold.

* * * * *